United States Patent
Kern et al.

(10) Patent No.: US 9,362,953 B2
(45) Date of Patent: Jun. 7, 2016

(54) EFFICIENT ERROR CORRECTION OF MULTI-BIT ERRORS

(71) Applicant: Infineon Technologies AG, Neubiberg (DE)

(72) Inventors: Thomas Kern, Munich (DE); Michael Goessel, Mahlow (DE); Christian Badack, Potsdam (DE)

(73) Assignee: Infineon Technologies AG, Neubiberg (DE)

( * ) Notice: Subject to any disclaimer, the term of this patent is extended or adjusted under 35 U.S.C. 154(b) by 270 days.

(21) Appl. No.: 13/958,047

(22) Filed: Aug. 2, 2013

(65) Prior Publication Data

US 2015/0039976 A1 Feb. 5, 2015

(51) Int. Cl.
*H03M 13/15* (2006.01)
*G06F 11/08* (2006.01)
*H03M 13/00* (2006.01)

(52) U.S. Cl.
CPC .............. *H03M 13/15* (2013.01); *G06F 11/08* (2013.01); *H03M 13/152* (2013.01); *H03M 13/1575* (2013.01); *H03M 13/6575* (2013.01)

(58) Field of Classification Search
CPC .............. H03M 13/15; H03M 13/152; H03M 13/1575; H03M 13/6575; G06F 11/08
USPC .................................... 714/781, 782, 785
See application file for complete search history.

(56) References Cited

U.S. PATENT DOCUMENTS

| 2003/0028842 A1* | 2/2003 | Katayama et al. ............ 714/781 |
| 2013/0139039 A1* | 5/2013 | Sforzin et al. ................ 714/782 |
| 2014/0095960 A1* | 4/2014 | Chu et al. ..................... 714/763 |

\* cited by examiner

*Primary Examiner* — Albert Decady
*Assistant Examiner* — Christian Dorman
(74) *Attorney, Agent, or Firm* — Eschweiler & Associates, LLC

(57) ABSTRACT

A circuitry for error correction includes a plurality of subcircuits for determining intermediate values $Zw_0$, $Zw_1$, $Zw_2$, $Zw_3$ to be used as coefficients in an error correction expression $(z_1^i, z_2^i, \ldots, z_m^i) = Zw_3 \cdot \alpha^{3ji} + Zw_2 \cdot \alpha^{2ji} + Zw_1 \cdot \alpha^{ji} + Zw_0$. The intermediate values $Zw_0$, $Zw_1$, $Zw_2$, $Zw_3$ are determined depending on subsyndromes $s_1$, $s_3$, $s_5$ so that in case of a 1-bit, 2-bit, or 3-bit error $z^i = (z_1^i, z_2^i, \ldots, z_m^i) = (0, 0, \ldots, 0)$ when an error occurred in the bit position i, and $z^i = (z_1^i, z_2^i, \ldots, z_m^i) \ne (0, 0, \ldots, 0)$ when no error occurred in the bit position i. A correction value $\Delta v_i = \overline{(z_1^i \vee z_2^i \vee \ldots \vee z_m^i)}$ for the bit position i may then be determined on the basis of the error correction expression evaluated for $\alpha^{ji}$.

18 Claims, 9 Drawing Sheets

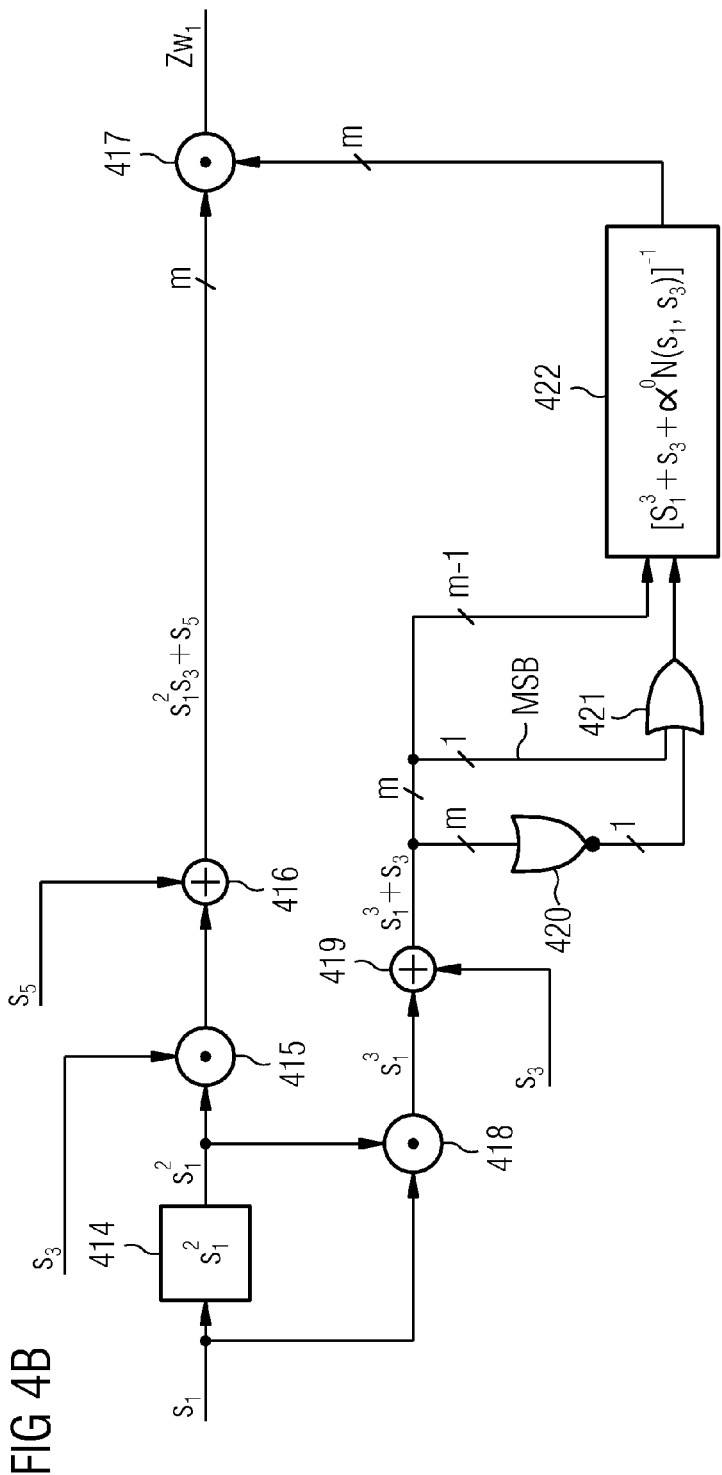
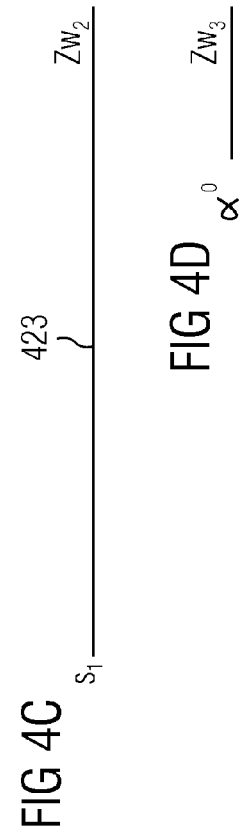
FIG 4B
FIG 4C
FIG 4D

EFFICIENT ERROR CORRECTION OF MULTI-BIT ERRORS

FIELD

Some embodiments relate to a circuitry for error correction and/or error detection. Some embodiments relate to a method for error correction and/or error detection. Some embodiments relate to an arbitrary 3-bit correction.

BACKGROUND

Error detection and correction or error control are techniques that may enable reliable delivery of digital data over unreliable communication channels and/or unreliable data storage devices. Error detection and correction belong to the field of information theory and coding theory and find application in computer science and telecommunication. Many communication channels and/or data storages may be subject to channel noise and interference, and thus errors may be introduced during transmission/storage from the source to a receiver. Error detection techniques may allow detecting such errors, while error correction may enable reconstruction of the original data. The data to be transmitted or stored may be provided, for example, in the form of binary words of a certain length.

It is known, in binary sequences or binary words of a certain length, to correct n random 1-bit errors, 2-bit errors and random 3-bit errors using BCH codes by combinational error correction circuits, as it is for example described in Okano, H. and Imai, H., "A construction method of high speed decoders using ROM's for Bose-Chadhuri-Hocquenghem and Reed Solomon Codes", IEEE Trans. Comp. C36 (10) 1165-1175, 1987.

When BCH codes are used over a Galois field $GF(2^m)$, then $n \geq 2^m-1$ and the error syndrome s may consist of 3m components, wherein the first m components may form the subsyndrome $s_1$, the second m components the subsyndrome $s_3$ and the third m components the subsyndrome $s_5$, as it is common when using BCH codes. If the total parity is considered, the error syndrome may still contain a further binary component which is to be designated by $s_P$.

SUMMARY

Embodiments provide a circuitry for error correction and possibly error detection of at least 1-bit, 2-bit and 3-bit errors of bits in an n-digit binary word $v'=v_1', \ldots, v_n'$ which resulted from bit errors from an n-digit codeword $v=v_1, \ldots, v_n$ of a binary BCH code C over the Galois field $GF(2^m)$, wherein $m \geq 4$. The code C comprises a code distance of at least $d \geq 7$. The BCH code C comprises an H matrix H, so that m first rows of the H matrix form a submatrix $H_1$, m second rows of the H matrix form a second submatrix $H_3$ and further m rows of the H matrix form a third submatrix $H_5$ with $$H_1=(h_1^1, \ldots, h_1^n), H_3=(h_3^1, \ldots, h_3^n) \text{ and } H_5=(h_5^1, \ldots, h_5^n),$$

wherein $$h_1^1=\alpha^{j1}, \ldots, h_1^n=\alpha^{jn},$$

$$h_3^1=\alpha^{3(j1)}, \ldots, h_3^n=\alpha^{3(jn)},$$

$$h_5^1=\alpha^{5(j1)}, \ldots, h_5^n=\alpha^{5(jn)},$$

applies, $\alpha$ is an element of the Galois field $GF(2^m)$ in its vector representation as an m-component binary column vector and the respective exponent j of $\alpha^j$ is to be interpreted modulo $2^m-1$ and $n \geq 2^m-1$ applies. The circuitry has the following features and comprises:

a syndrome generator Synd for determining an error syndrome s, wherein m first components of s form an m-component subsyndrome $s_1$, m second components of s form a second m-component subsyndrome $s_3$ and further m components of s form a third subsyndrome $s_5$, wherein $$s_1=H_1 \cdot v', s_3=H_3 \cdot v', \text{ and } s_5=H_5 \cdot v'$$

apply, a plurality of subcircuits so that for each bit $v_i'$ subject to possible error correction of the n-digit binary word $v'=v_1', \ldots, v_n'$ a subcircuit $SK_i$ exists which is configured so that it forms, from intermediate values $Zw_0$, $Zw_1$, $Zw_2$, $Zw_3$ which are equal for all bit positions subject to possible error correction, a correction value $\Delta v_i$ according to the following relation $$\Delta v_i = \overline{(z_1^i \vee z_2^i \vee \ldots \vee z_m^i)}$$

wherein $$(z_1^i, z_2^i, \ldots, z_m^i) = Zw_3 \cdot \alpha^{3ji} + Zw_2 \cdot \alpha^{2ji} + Zw_1 \cdot \alpha^{ji} + Zw_0$$

and the intermediate values $Zw_0$, $Zw_1$, $Zw_2$, $Zw_3$ are determined depending on the subsyndromes $s_1$, $s_3$, $s_5$ so that in case of a 1-bit error or a 2-bit error or a 3-bit error the following applies: $z^i=(z_1^i, z_2^i, \ldots, z_m^i)=(0, 0, \ldots, 0)$ when an error occurred in the bit position i and $z^i=(z_1^i, z_2^i, \ldots, z_m^i) \neq (0, 0, \ldots, 0)$ when no error occurred in the bit position i;

for determining the intermediate values $Zw_0$, $Zw_1$, $Zw_2$, and $Zw_3$ one subcircuit $SZw_0$, $SZw_1$, $SZw_2$ and $SZw_3$ each exists which is each configured so that it provides the same intermediate values $Zw_0$, $Zw_1$, $Zw_2$ and $Zw_3$ from the sub-syndromes $s_1$, $s_3$, $s_5$ for each bit position subject to possible error correction of the word v'; and a combinational circuit Vkn exists which is configured so that it combines bits that are subject to possible error correction $v_i'$ in a componentwise manner with corresponding correction values $\Delta v_i$ provided by the subcircuits $SK_i$ into possibly corrected bits $v_i^{cor}$.

Embodiments provide a corresponding method for an error correction and error detection. Embodiments provide a corresponding non-transitory storage medium.

BRIEF DESCRIPTION OF THE DRAWINGS

Embodiments of the present disclosure will be described using the accompanying figures, in which:

FIGS. 4A to 4D show schematic block diagrams of possible implementation of subcircuits $SZw_0$, $SZw_1$, $SZw_2$, $SZw_3$ for determining the intermediate values $Zw_0$, $Zw_2$, and $Zw_3$;

DETAILED DESCRIPTION

Figure 1:
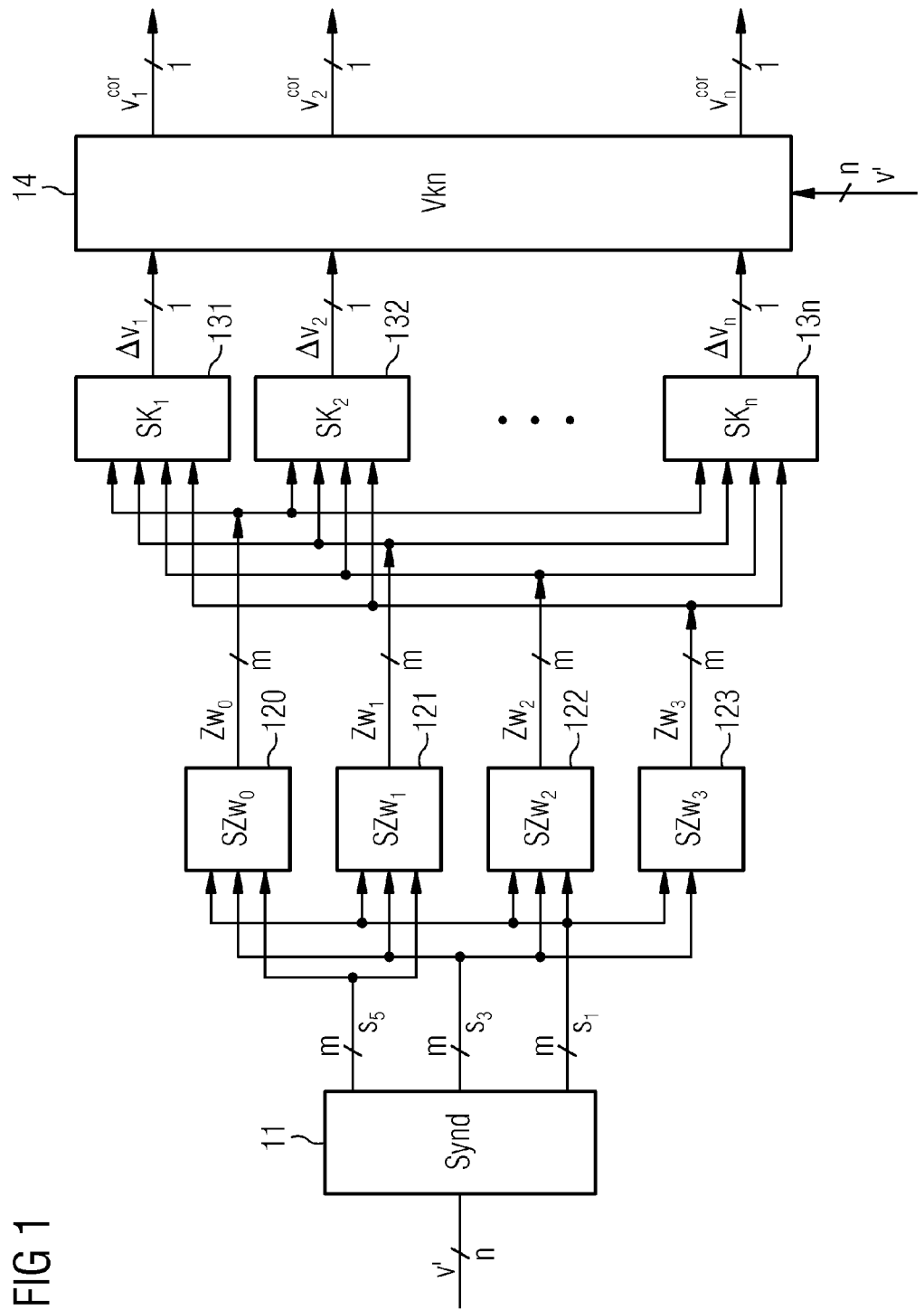
FIG. 1 shows a schematic block diagram of a circuitry for an error correction.

The conventional operation when correcting random 3-bit errors by combinational error correction circuits may be typically connected with a relatively high hardware expense and a relatively long signal run time for determining the corresponding error correction signals. In particular, a relatively long signal run time for correction signals may have a limiting effect on the clock rate.

It would be desirable to facilitate the correction of 1-bit, 2-bit and 3-bit errors in binary data words and in particular to improve the required error correction circuits so that an effort as small as possible and a signal run time as short as possible is required.

Theoretical Background

For the error correction of randomly distributed multi-bit errors, BCH codes may be used as it is known to a person skilled in the art and described for example in Lin, S., Costello, D. "*Error Control Coding*" Prentice Hall, 1983, wherein reference is in particular made to pages 143-160. Likewise, the document by Okano, H. and Imai, H., "*A construction method of high speed decoders using ROM's for Bose-Chadhuri-Hocquenghem and Reed Solomon Codes*", IEEE Trans. Comp. C36 (10) 1165-1175, 1987 is to be mentioned in which combinational circuits for the error correction for BCH codes are presented.

A BCH Code is a special linear code which, as any linear code, may be described by a parity check matrix H and a generator matrix G which may for example be derived from the parity check matrix. If the code has the length of N and comprises k information bits, then H is an (M, N) matrix with M rows and N columns, wherein M=N−k. The generator matrix G is then a (k, N) matrix with k rows and N columns, and the code comprises M check bits.

An unshortened 3-bit error correcting BCH code may be described by an H matrix $$H = \begin{pmatrix} H_1 \\ H_3 \\ H_5 \end{pmatrix} = (h_1, \ldots, h_N)$$

wherein the H matrix is presented in a separated form. Conventionally, $H_1$, $H_3$ and $H_5$ may be selected to be $H_1 = (\alpha^0, \alpha^1, \ldots, \alpha^{N-1}) = (h_1^1, \ldots, h_i^1, \ldots, h_N^1),$ $H_3 = (\alpha^0, \alpha^3, \ldots, \alpha^{3i}, \ldots, \alpha^{3(N-1)}) = (h_1^3, \ldots, h_i^3, \ldots, h_N^3),$ and $H_5 = (\alpha^0, \alpha^5, \ldots, \alpha^{5i}, \ldots, \alpha^{5(N-1)}) = (h_1^5, \ldots, h_i^5, \ldots, h_N^5),$ when the code is unshortened.

Here, $\alpha$ may be selected as an element of a finite field $GF(2^m)$ which is also called a Galois field. Frequently, $\alpha$ may be selected to be a primitive element. Then, $\alpha^i$ for $i=0, \ldots, 2^m-2$, except for the element 0, may assume any possible values of the Galois field. $N=2^m-1$ then applies. The exponents of $\alpha^j$, $\alpha^{3j}$ and of $\alpha^{5j}$ may be determined modulo $2^m-1$.

$H_1$, $H_3$ and $H_5$ typically each may be (m, N) matrices comprising m rows and $N=2^m-1$ columns. In special application cases it may be the case that some rows of the m rows for example of the matrix $H_5$ may be linearly dependent. In such a case, rows of the matrix $H_5$ may be omitted until all rows are linearly independent. For example, the number of rows of the matrix $H_5$ may then also be smaller than m.

The elements $\alpha^i$ of the Galois field $GF(2^m)$ in their vector representation may be m-digit binary column vectors.

If L columns of the H matrix of the unshortened BCH code are deleted, an H matrix of a shortened BCH code of the length n=N−L may be obtained. For a shortened code the following applies: $n=N-L<2^m-1$.

It is possible to supplement the H matrix H by a row consisting of only ones. An additional row consisting of only ones in the H matrix corresponds to the additional consideration of the total parity.

When considering the total parity the H matrix may have the form of $$H = \begin{pmatrix} H_1 \\ H_3 \\ H_5 \\ P \end{pmatrix}$$

wherein P is a row consisting of only ones.

It is also possible, when shortening the code, to delete all columns of the H matrix which, for example, in the components which correspond to the rows of the matrix $H_3$ comprise an even number of ones. The remaining columns of the H matrix may then only comprise columns which, in the components corresponding to the partial matrix $H_3$, always comprise an odd number of ones. In such a case, the total parity may simply be determined as an XOR sum of the components of the subsyndrome $s_3$, which may be advantageous. The rows which correspond to the partial matrix $H_3$ may then form a subset of rows, so that the components of columns which belong to this subset of rows comprise an odd number of ones. It is also possible to select a different subset of rows and delete columns when shortening the H matrix so that the remaining columns in the components which belong to the selected subset comprise an odd number of ones. The parity may then be formed as an XOR sum of the components of the syndrome which belong to the selected subset of rows.

Now a shortened BCH code of the length n is considered, wherein $n=N L<2^m-1$. A codeword of this code $v=v_1, \ldots, v_n$, which is also referred to as a code vector consists of n components $v_1, v_2, \ldots, v_n$. Here, a code vector may be described as a row vector or as a column vector. If a matrix is multiplied by a vector from the right, then the vector is to be interpreted as a column vector and the result is a column vector. If a matrix is multiplied by a vector from the left, then the vector is a row vector and the result of the multiplication is also a row vector. It is not required then to explicitly designate the corresponding vectors as being column vectors or row vectors as it is clear from the context whether it is a column vector or a row vector. If it is to be specially noted that a vector w is represented as a column vector, it is written as $w^T$.

If a codeword $v=v_1, \ldots, v_n$ is erroneously changed into a word $v'=v_1', \ldots, v_n'$, then the difference between v and v' may be described by an error vector e with $e=e_1, \ldots, e_n = v_1 \oplus v_1', \ldots, v_n \oplus v_n' = v \oplus v'$ A component $e_i$ of the error vector e is equal to 1, when $v_i$ and $v_i'$ are different and $v_i = v_i' \oplus 1 = \overline{v_i'}$. A component $e_j$ of the error vector e is equal 0, when $v_j$ and $v_j'$ are equal and $v_j = v_j'$ applies.

If an error may be corrected by an error correction circuit, then the correction values output by the error correction circuit may be equal to the components of the error vector and the correction circuit in this case outputs the correction value $e_i$ at the i-th output of its n outputs. The correction value $e_i$ may then be XOR-ed with the component $v_i'$ to be corrected into $v^{cor} = v_i' \oplus e_i$. The correction values $e_i$ may also be combined into a correction vector. The correction vector is equal to the error vector if the error may be corrected by the code. If the vector v is the code vector of a separable code wherein the data bits and the check bits in the code vector v are separated, then it is also possible to only correct the data bits or even only part of the data bits of the vector v'. In these cases, the bits for which the possibility of error correction is desired and/or implemented may be referred to as "bits subject to possible error correction".

The error syndrome $s = (s_1, s_3, s_5, s_P)$ of a word v' may be determined by $$s = H \cdot v' \quad (1)$$

wherein, $$s_1 = H_1 \cdot v', \quad (2)$$

$$s_3 = H_3 \cdot v', \quad (3)$$

$$s_5 = H_5 \cdot v', \quad (4)$$

$$s_P = P \cdot v' = (1, \ldots, 1) \cdot v' = v_1' \oplus v_2' \oplus \ldots \oplus v_n' \quad (5)$$

apply.

The error syndrome of a codeword v is typically equal to 0, so that for a codeword v the following applies $$s = H \cdot v = 0 \quad (6)$$

and for a non-codeword $v' = v \oplus e$ the following applies $$s = H \cdot v' = H \cdot (v \oplus e) = H \cdot v \oplus H \cdot e = H \cdot e \neq 0. \quad (7)$$

The error syndrome s may be determined by the error vector e.

In order to determine the associated correct codeword from the erroneous non-codeword v', those components $v_i'$ are to be inverted for which $e_j = 1$ applies, so that $e_j$ is the corresponding correction value determined by the error correction circuit.

For the considered, shortened BCH code, the error vector e is to be determined from the error syndrome $s = (s_1, s_3, s_5, s_P)$ with the H matrix $$H = \begin{pmatrix} H_1 \\ H_3 \\ H_5 \\ P \end{pmatrix}.$$

The matrices $H_1$, $H_3$, $H_5$ are described by their columns:

$$H_1 = (h_1^1, h_2^1, \ldots, h_n^1) = \alpha^{i_1}, \alpha^{i_2}, \ldots, \alpha^{i_n}, \quad (8)$$

$$H_3 = (h_1^3, h_2^3, \ldots, h_n^3) = \alpha^{3(i_1)}, \alpha^{3(i_2)}, \ldots, \alpha^{3(i_n)}, \quad (9)$$

$$H_5 = (h_1^5, h_2^5, \ldots, h_n^5) = \alpha^{5(i_1)}, \alpha^{5(i_2)}, \ldots, \alpha^{5(i_n)}, \quad (10)$$

and $$P = \underbrace{(1, 1, \ldots, 1)}_{n}. \quad (11)$$

The exponents of $\alpha$ may be, as already mentioned, determined modulo $2^m - 1$, and the exponents $i_1, i_2, \ldots, i_n$ are all pairwise different. It is not necessary that for $i_j = j$ for $j = 1, \ldots, n$.

If a 1-bit error is present in the j-th bit, the following applies $$s_1 = \alpha^{ij}, \quad (12)$$

$$s_3 = \alpha^{3(ij)}, \quad (13)$$

$$s_3 = \alpha^{3(ij)}, \quad (14)$$

$$s_P = 1 \quad (15)$$

and $s_1^3 = s_3$, $s_1^5 = s_5$.

If a 2-bit error exists in bit positions j and l, the following applies $$s_1 = \alpha^{ij} \oplus \alpha^{il}, \quad (16)$$

$$s_3 = \alpha^{3(ij)} \oplus \alpha^{3(il)}, \quad (17)$$

$$s_5 = \alpha^{5(ij)} \oplus \alpha^{5(il)}, \quad (18)$$

$$s_P = 0 \quad (19)$$

and $s_1^3 \neq s_3$.

If a 3-bit error exists in bit positions j, l and k, the following applies $$s_1 = \alpha^{ij} \oplus \alpha^{il} \oplus \alpha^{ik}, \quad (20)$$

$$s_3 = \alpha^{3(ij)} \oplus \alpha^{3(il)} \oplus \alpha^{3(ik)}, \quad (21)$$

$$s_5 = \alpha^{5(ij)} \oplus \alpha^{5(il)} \oplus \alpha^{5(ik)}, \quad (22)$$

$$s_P = 0 \quad (23)$$

and $s_1^3 \neq s_3$.

It would be desirable for the error correction circuit to efficiently determine the error positions of any 1-bit error or any 2-bit error or any 3-bit error from the error syndrome, i.e. from the syndrome components $s_1$, $s_3$ and $s_5$ of the BCH code and to perform a correction of the bits detected to be faulty in the determined bit positions of the data word.

In principle, this would be possible by an allocator, for example implemented as an ROM or as a combinational function which allocates the corresponding faulty bits which are to be corrected to the values of the error syndrome $s = (s_1, s_3, s_5, s_P)$, i.e., to all possible values of the error syndrome s.

For reasons of cost and complexity, this may be practically impossible and hence not be implemented in actual systems due to the large word width of the syndrome s.

BCH codes may be capable of determining the position of faulty bits by zeroes or roots of corresponding locator polynomials. The coefficients of the locator polynomials may be determined by the components of the error syndrome. In error correction, first of all the number of errors may be determined. Depending on the number of errors a locator polynomial corresponding to the number of errors may be calculated whose zeroes determine the error position of the errors to be corrected.

Typically, different locator polynomials of different degrees may be used for different numbers of errors in order to determine the error positions to be corrected.

Thus, for 3-bit errors a locator polynomial of the third degree may exist which has three zeroes, wherein those three zeroes may determine the bit positions which have to be corrected in case of a 3-bit error. For 2-bit errors there may be a locator polynomial of the second degree which has two zeroes, wherein in case of a two-bit error those two zeroes may determine the bit positions which are corrected.

For 1-bit errors a further locator polynomial of the first degree may be provided which has one zero, wherein in case of a 1-bit error the zero may determine the bit position which is corrected.

In order to determine the occurred error positions, first of all the number of errors may be determined. Based on the determined number of errors, the locator polynomial to be used may then be determined and the zeroes of this locator polynomial may be determined. These zeroes correspond to the bit positions which are to be corrected.

In Okano, H. and Imai, H., "A construction method of high speed decoders using ROM's for Bose-Chadhuri-Hocquenghem and Reed Solomon Codes", IEEE Trans. Comp. C36 (10) 1165-1175, 1987 it is described that the locator polynomial of the third degree in case of only two errors comprises one zero equal to 0 and two further zeroes which correspond to the positions of the two faulty bits to be corrected.

In case only one error exists the locator polynomial of the third degree does not allow to derive the position of the only one existing error from this polynomial of the third degree. Depending on whether a 1-bit error or whether a 2-bit or 3-bit error exists, a first degree polynomial or a third degree polynomial is to be used for determining the correction locations from the zeroes of those polynomials. In principle, the determination of the bits to be corrected may be performed so that first of all the number of errors occurred may be determined. Based on the number of errors occurred the corresponding locator polynomial may be selected. The zeroes of the selected locator polynomial may determine the bit positions to be corrected. In principle, the zeroes and thus the bit positions to be corrected may be tabulated depending on the coefficients of the selected locator polynomial of the corresponding degree and be determined by an allocator. The coefficients of the corresponding locator polynomial, as indicated, may depend on the subsyndromes $s_1$, $s_3$, $s_5$ of the error syndrome which each may have a word width m, so that the zeroes may depend on data of a word width 3·m. For realistic word widths it is practically not possible due to the large word widths of the coefficients to determine the zeroes of the known locator polynomials by an allocator.

In Okano, H. and Imai, H., "A construction method of high speed decoders using ROM's for Bose-Chadhuri-Hocquenghem and Reed Solomon Codes", IEEE Trans. Comp. C36 (10) 1165-1175, 1987 the variables of the corresponding locator polynomial are first of all transformed so that the transformed polynomial only comprises one single coefficient which depends on the values of the subsyndromes $s_1$, $s_3$, $s_5$. This coefficient has a word width of m. The transformation is done so that the further coefficients of the transformed polynomial are equal to 1 or 0 and do not depend anymore on the subsyndromes $s_1$, $s_3$, $s_5$. The zeroes of the transformed polynomial may then be determined via an allocator from this one coefficient which is determined, for example by a ROM, from the subsyndromes $s_1$, $s_3$, $s_5$ and only comprises the word width m. The zeroes of the original locator polynomial may be determined by back-transformation and using a decoder.

For different numbers of errors, as mentioned above, different locator polynomials are used which are represented in Table 1 of Okano, H. and Imai, H., "A construction method of high speed decoders using ROM's for Bose-Chadhuri-Hocquenghem and Reed Solomon Codes", IEEE Trans. Comp. C36 (10) 1165-1175, 1987.

In the error correction according to Okano, H. and Imai, H., "A construction method of high speed decoders using ROM's for Bose-Chadhuri-Hocquenghem and Reed Solomon Codes", IEEE Trans. Comp. C36 (10) 1165-1175, 1987 it is for example disadvantageous that for the error correction relatively complicated transformation methods are required, that depending on the number of errors different polynomials are to be evaluated, and that the error correction is relatively slow.

By the disclosure, these disadvantages are to be at least partially reduced.

According to at least one aspect of the disclosure, for each bit $v_i'$ to be corrected a subcircuit $SK_i$ for correcting the i-th bit is provided which is implemented so that may form a correction value $\Delta v_i$ in parallel for each bit $v_i'$ to be corrected of the n-digit binary word $v'=v_1', \ldots, v_n'$. The error correction circuit $SK_i$ may be configured so that it forms a correction value $\Delta v_i$ from the intermediate values $Zw_0$, $Zw_1$, $Zw_2$, $Zw_3$ according to the following relation $$\Delta v_i = \overline{(z_1^i \vee z_2^i \vee \ldots \vee z_m^i)}$$

wherein $$(z_1^i, z_2^i, \ldots, z_m^i) = Zw_3 \cdot \alpha^{3ji} + Zw_2 \cdot \alpha^{2ji} + Zw_1 \cdot \alpha^{ji} + Zw_0.$$

Here, for all bits to be corrected the same intermediate values $Zw_0$, $Zw_1$, $Zw_2$, $Zw_3$ are used so that the intermediate values only have to be provided once in the circuitry.

The intermediate values $Zw_0$, $Zw_1$, $Zw_2$, $Zw_3$ may be determined depending on the subsyndromes $s_1$, $s_3$, $s_5$ so that in case of a 1-bit error or a 2-bit error or a 3-bit error $z^i = (z_1^i, z_2^i, \ldots, z_m^i) = (0, 0, \ldots, 0)$ when an error occurred in the bit position i, and $z^i = (z_1^i, z_2^i, \ldots, z_m^i) \neq (0, 0, \ldots, 0)$ when no error occurred in the bit position in the bit position i. It is typically not necessary to evaluate different equations in different error cases, that is, it typically is not necessary to evaluate different equation for 1-bit errors, 2-bit errors, and 3-bit errors.

In case no error is present and $s_1 = s_3 = s_5 = 0$ applies, for all bits to be corrected $z^i = (z_1^i, z_2^i, \ldots, z_m^i) \neq (0, 0, \ldots, 0)$ applies and thus $\Delta v_i = 0$ applies, so that switching off the error correction circuit is not necessary in the error-free case.

The correction value $\Delta v_i$ is equal to 1 if all components of $z_1^i, \ldots, z_m^i$ of $z^i$ are equal to 0 or if $z^i$ is equal to the zero-value in $GF(2^m)$. The correction value $\Delta v_i$ is equal to 0 if at least one of the components of $z_1^i, \ldots, z_m^i$ of $z^i$ is equal to 1 or if $z^i$ is not equal to the zero-value in $GF(2^m)$.

Therefore the same correction values are obtained if all the intermediate values $Zw_0$, $Zw_1$, $Zw_2$, $Zw_3$ are multiplied by the same factor which for all values of the subsyndromes $s_1$, $s_3$ and $s_5$ is not equal to 0. Thereby the multiplication is the multiplication in the Galois field $GF(2^m)$.

The determination of the intermediate values $Zw_0$, $Zw_1$, $Zw_2$, and $Zw_3$ may be performed by the corresponding subcircuit $SZw_0$, $SZw_1$, $SZw_2$, and $SZw_3$. The subcircuits $SZw_0$, $SZw_1$, $SZw_2$, and $SZw_3$ may be implemented so that they form the intermediate values $Zw_0$, $Zw_1$, $Zw_2$, and $Zw_3$ from the subsyndromes $s_1$, $s_3$, $s_5$. Further, a combinational circuit Vkn may exist for componentwise combining bits $v_i'$ of $v'$ to be corrected, said combinational circuit Vkn combining correction values $\Delta v_i$ provided by the subcircuit $SK_i$ with bits $v_i'$ to be corrected. It is configured so that it forms the corrected bits $v_i^{cor}$ from the bits $v_i'$ to be corrected and the provided correction values $\Delta v_i$, wherein for example $v_i^{cor} = v_i' \oplus \Delta v_i$ applies.

It is possible for the subcircuits $SZw_0$, $SZw_1$, $SZw_2$, and $SZw_3$ to be configured so that they provide, depending on the subsyndromes $s_1$, $s_3$, and $s_5$, the intermediate values, $$Zw_0 = \left( s_1^3 + s_3 + \frac{s_1^3 \cdot s_3 + s_1 \cdot s_5}{s_1^3 + s_3 + \alpha^0 \cdot N(s_1, s_3)} \right), \tag{24}$$

$$Zw_1 = \frac{s_1^2 \cdot s_3 + s_5}{s_1^3 + s_3 + \alpha^0 \cdot N(s_1, s_3)}, \quad (25)$$

$$Zw_2 = s_1, \quad (26)$$

$$Zw_3 = \alpha^0 \quad (27)$$

wherein $$N(s_0, s_3) = \overline{r_1 \vee r_2 \vee \ldots \vee r_m}$$

applies and $$(r_1, r_2, \ldots, r_m) = s_1^3 + s_3$$

applies.

The operation + designates the addition of the corresponding elements in the Galois field $GF(2^m)$ which, in the vector representation, corresponds to the componentwise XOR-combination of the corresponding m-component binary vectors. The operation · refers to the operation of the multiplication in the Galois field $GF(2^m)$.

It is likewise possible that the subcircuits $SZw_0$, $SZw_1$, $SZw_2$, $SZw_3$ are configured so that the subcircuits $SZw_0$, $SZw_1$, $SZw_2$, and $SZw_3$ provide, depending on the subsyndromes $s_1$, $s_3$, $s_5$, the intermediate values $$Zw_0 = +s_1^6 + s_3^2 + s_1^3 + s_3 + s_1 \cdot s_5, \quad (28)$$

$$Zw_1 = s_1 s_3 + s_5, \quad (29)$$

$$Zw_2 = s_1 \cdot [s_1^3 + s_3 + \alpha^0 \cdot N(s_1, s_3)] \quad (30)$$

$$Zw_3 = s_1^3 + s_3 + \alpha^0 \cdot N(s_1, s_3) \quad (31)$$

wherein $$N(s_1, s_3) = \overline{r_1 \vee r_2 \vee \ldots \vee r_m}$$

applies and $$(r_1, r_2, \ldots, r_m) = s_1^3 + s_3$$

applies.

The operation + designates the addition of the corresponding elements in the Galois field $GF(2^m)$ which, in the vector representation, corresponds to the componentwise XOR-combination of the corresponding m-component binary vectors. The operation · refers to the operation of the multiplication in the Galois field $GF(2^m)$.

The intermediate values determined by equations (28) to (31) result from the intermediate values determined by equations (24) to (27) by multiplying the corresponding intermediate values determined by equations (24) to (27) with the following factor $$[s_1^3 + s_3 + \alpha^0 \cdot N(s_1, s_3)].$$

The factor $[s_1^3 + s_3 + \alpha^0 \cdot N(s_1, s_3)]$ is always unequal $(0, 0, \ldots, 0)$. If $s_1^3 + s_3 = (0, 0, 0)$, then $N(s_1, s_3) \neq 0$, and if $s_1^3 + s_3 \neq (0, 0, \ldots, 0)$ then $N(s_1, s_3) = 0$.

The following applies $$[(s_1^3 + s_3) + (\alpha^0 \cdot N(s_1, s_3))] = [(s_1^3 + s_3) \vee (\alpha^0 \cdot N(s_1, s_3))],$$

wherein $[(s_1^3 + s_3) + (\alpha^0 \cdot N(s_1, s_3))]$ describes the componentwise XOR-operation of $(s_1^3 + s_3)$ and $(\alpha^0 \cdot N(s_1, s_3))$ in the vector representation, while $[(s_1^3 + s_3) \vee (\alpha^0 \cdot N(s_1, s_3))]$ describes the componentwise OR operation of $(s_1^3 + s_3)$ and $(\alpha^0 \cdot N(s_1, s_3))$ in the vector representation. This equality results from the fact that only when $s_1^3 + s_3 = (0, 0, \ldots, 0)$ then $N(s_1, s_3) = 1$ and thus $\alpha^0 \cdot N(s_1, s_3) = \alpha^0 = 1, 0, \ldots, 0 \neq (0, 0, \ldots, 0)$ and that always when $s_1^3 + s_3 \neq (0, 0, \ldots, 0)$ then $N(s_1, s_3) = 0$ and $\alpha^0 \cdot N(s_1, s_3) = (0, 0, \ldots, 0)$ applies. The values 1 and 1 of the components of the vectors to be combined do not occur for which the XOR operation $1 \oplus 1 = 0$ and $1 \vee 1 = 1$ of the OR-operation would yield different results. In principle it is then of course also possible to combine some components with the operation XOR and the remaining components with the operation OR. For the description to remain as simple as possible, in the further description the XOR operation is used although of course also an OR operation may be used.

Independent of whether the intermediate values $Zw_0$, $Zw_1$, $Zw_2$, $Zw_3$ are determined according to equations (24) to (27) or according to equations (28) to (31), the same correction values of the bits to be corrected result. The intermediate values determined by equations in (24) to (27) and determined according to equations (28) to (31) are thus referred to as equal. It is clear from the context what intermediate values are used.

The disclosure is now to be explained with reference to embodiments. In FIG. 1, an inventive circuitry is schematically illustrated for correcting 1-bit, 2-bit and 3-bit errors. It comprises a syndrome generator Synd 11, a subcircuit $SZw_0$ 120 for determining an intermediate value $Zw_0$, a subcircuit $SZw_1$ 121 for determining an intermediate value $Zw_1$, a subcircuit $SZw_2$ 122 for determining an intermediate value $Zw_2$, and a subcircuit $SZw_3$ 123 for determining an intermediate value $Zw_3$. The circuitry further comprises, for i=1, . . . , n, n subcircuits $SK_i$ 13i for determining a correction value $\Delta v_i$. The circuitry further comprises a combinational circuit Vkn 14 for componentwise combining the word $v' = v_1', \ldots v_n'$ to be corrected with the correction values $\Delta v_1, \ldots, \Delta v_n$ determined from the subcircuits $SK_1$ 131, . . . , $SK_n$ 13n. The syndrome generator Synd 11 forms the components $s_1$, $s_3$, $s_5$ of the error syndrome $s = (s_1, s_3, s_5)$ for example by XOR operations from the data word $v' = v_1', \ldots, v_n'$ applied to its n-component binary input, according to the following relation $$s_1 = H_1 \cdot v', s_3 = H_3 \cdot v', s_5 = H_5 \cdot v',$$

which the syndrome generator Synd 11 may provide at its three m-bit wide binary outputs.

The matrices $H_1$, $H_3$, $H_5$ may be submatrices of an H matrix $$H = \begin{pmatrix} H_1 \\ H_3 \\ H_5 \end{pmatrix}$$

of a BCH code of the length n over the Galois field $GF(2^m)$ for an error correction of 1-bit, 2-bit and 3-bit errors and with 3 m correction bits.

The first output of the syndrome generator Synd 11 which carries the subsyndrome $s_1$ may be connected to a first input each of the subcircuits $SZw_0$ 120, $SZw_1$ 121, $SZw_2$ 122, $SZw_3$ 123 for forming intermediate values $Zw_0$, $Zw_1$, $Zw_2$, $Zw_3$. The second output of the syndrome generator Synd 11 which carries the subsyndrome $s_3$ may be connected to a second input each of the subcircuits $SZw_0$ 120, $SZw_1$ 121, $SZw_2$ 122, $SZw_3$ 123. The third output of the syndrome generator Synd 11 which carries the subsyndrome $s_5$ may be connected to a third input each of the subcircuits $SZw_0$ 120, $SZw_1$ 121.

The m bit wide output of the subcircuit $SZw_0$ 120 which carries the intermediate value $Zw_0$ may be connected to a first input each of the subcircuit $SK_j$ 13j, for j=1, . . . , n, for forming a correction value $\Delta v_j$.

The m bit wide output of the subcircuit $SZw_1$ 121 which carries the intermediate value $Zw_1$ may be connected, for j= 1, . . . , n, to a second input each of the subcircuit $SK_j$ 13j for forming the correction value $\Delta v_j$.

The m bit wide output of the subcircuit $SZw_2$ 122 which carries the intermediate value $Zw_2$ may be connected, for j=1, n, to a third input each of the subcircuit $SK_j$ 13$j$ for forming the correction value $\Delta v_j$.

The m bit wide output of the subcircuit $SZw_3$ 123 which carries the intermediate value $Zw_3$ may be connected, for j=1, n, to a fourth input each of the subcircuit $SK_j$ 13$j$ for forming the correction value $\Delta v_j$.

For k=1, ..., n the 1-bit wide output of the subcircuit $SK_k$ 13$k$ may be connected to the 1-bit wide k-th input each of the first n binary inputs of the combinational circuit Vkn 14 at whose n further binary inputs the components $v_1', \ldots, v_n'$ of the data word to be corrected $v'=v_1', \ldots, v_n'$ are applied. The combinational circuit Vkn 14, for l=1, ..., n, may output at its n binary outputs the corrected values $v_l^{cor}=v_l' \oplus \Delta v_l$ which are for example implemented by componentwise XOR operations.

In other words, the circuitry for error correction may comprise a plurality of subcircuits for determining intermediate values $Zw_0, Zw_1, Zw_2, Zw_3$ to be used as coefficients in an error correction polynomial $(z_1^i, z_2^i, \ldots, z_m^i) = Zw_3 \cdot \alpha^{3j_i} + Zw_2 \cdot \alpha^{2j_i} + Zw_1 \cdot \alpha^{j_i} + Zw_0$. The intermediate values $Zw_0, Zw_1, Zw_2, Zw_3$ may be determined depending on subsyndromes $s_1, s_3, s_5$ so that in case of a 1-bit, 2-bit, or 3-bit error $z^i=(z_1^i, z_2^i, \ldots, z_m^i)=(0, 0, \ldots, 0)$ when an error occurred in the bit position i, and $z^i=(z_1^i, z_2^i, \ldots, z_m^i) \neq (0, 0, \ldots, 0)$ when no error occurred in the bit position i. A correction value $\Delta v_i = \overline{(z_1^i \vee z_2^i \vee \ldots \vee z_m^i)}$ for the bit position i may then be determined on the basis of the error correction polynomial evaluated for the point $\alpha^{j_i}$. The determination of at least one of the intermediate values $Zw_0, Zw_1, Zw_2, Zw_3$ may comprise an algebraic term that is a function of at least two of the subsyndromes, said algebraic term being indicative of whether a 1-bit error exists in the possibly erroneous binary word v'.

Figure 2:
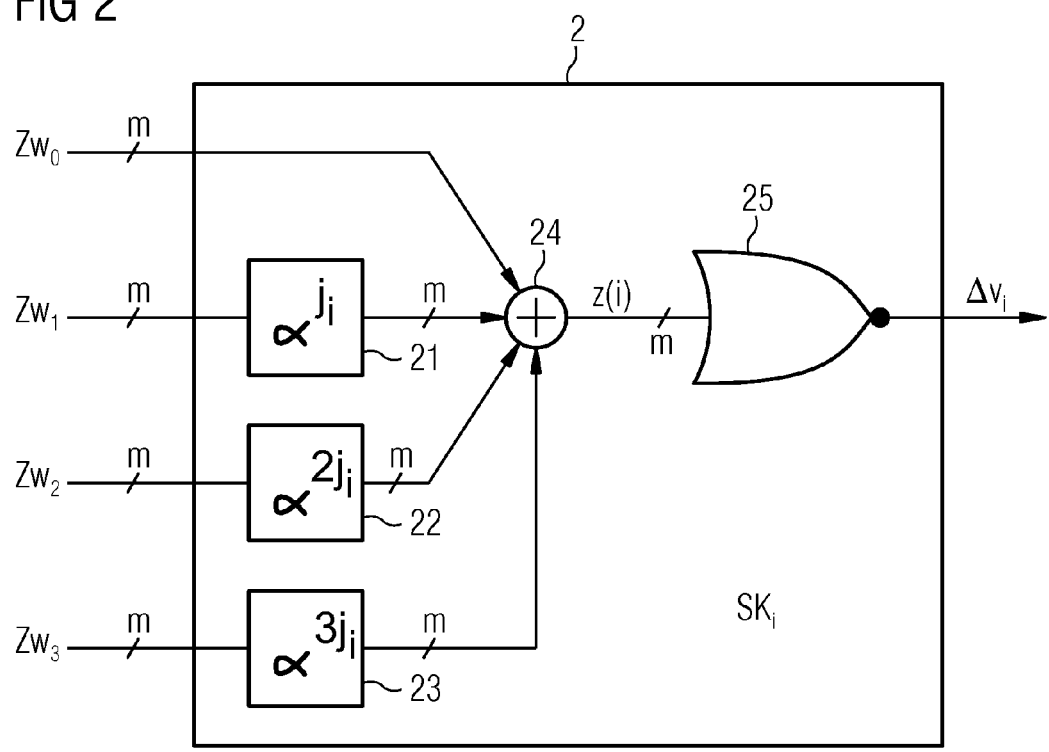
FIG. 2 shows a schematic block diagram of a possible implementation of a subcircuit $SK_i$ for determining a correction signal $\Delta v_i$ for the i-th bit of the word v' on the basis of common intermediate values $Zw_0$, $Zw_1$, $Zw_2$, and $Zw_3$.

In an embodiment, FIG. 2 shows one possible implementation of a subcircuit $SK_i$ 2. It may comprise the constant multipliers 21, 22 and 23, the XOR circuit 24 and the NOR circuit 25.

The first m-bit wide input to which the intermediate value $Zw_0$ is applied may be fed to a first m-bit wide input of an XOR circuit 24. The second m-bit wide input which carries the intermediate signal $Zw_1$ may be connected to the input of the constant multiplier 21 whose m-bit wide output may be connected to a second m-bit wide input of the XOR circuit 24. In the constant multiplier 21 the input intermediate value $Zw_1$ may be multiplied by the constant factor $\alpha^{j_i}$. The multiplication may be a multiplication in the Galois field $GF(2^m)$.

The concrete implementation of the constant multiplier 21 may be determined by multiplying both $Zw_1$ and also $\alpha^{j_i}$ in their respective polynomial representation with each other modulo the modular polynomial of the Galois field $GF(2^m)$ and by implementing the resulting linear equations by XOR operations.

The third m-bit wide input of subcircuit $SK_i$ 2 which carries the intermediate signal $Zw_2$ may be connected to the input of the constant multiplier 22 whose m-bit wide output may be connected to a third m-bit wide input of the XOR circuit 24. In the constant multiplier, the input intermediate value $Zw_2$ may be multiplied by the constant factor $\alpha^{2j_i}$. The multiplication may again be a multiplication in the Galois field $GF(2^m)$.

The concrete implementation of the constant multiplier 22 may be deter, mined by multiplying both $Zw_2$ and also $\alpha^{2j_i}$ in their respective polynomial representation with each other modulo the modular polynomial of the Galois field $GF(2^m)$ and by implementing the resulting linear equations by XOR operations.

The fourth m-bit wide input which carries the intermediate signal $Zw_3$ may be connected to the input of the constant multiplier 23 whose m-bit wide output may be connected to a fourth m-bit wide input of the XOR circuit 24. In the constant multiplier, the input intermediate value $Zw_3$ may be multiplied by the constant factor $\alpha^{3j_i}$. The multiplication may be again a multiplication in the Galois field $GF(2^m)$.

The concrete implementation of the constant multiplier 23 may be determined by multiplying both $Zw_3$ and also $\alpha^{3j_i}$ in their respective polynomial representation with each other modulo the modular polynomial of the Galois field $GF(2^m)$ and by implementing the resulting linear equations by XOR operations.

The m-bit wide output of the XOR circuit 24 which carries the value z(i) may be connected to the m-bit wide input of an NOR circuit 25 which, at its 1-bit wide output, outputs the correction signal $\Delta v_i$.

In case the intermediate value $Zw_3$ is constantly equal to $\alpha^0$, a particular implementation for the subcircuit $SK_i$ may be provided.

As $\alpha^0 \cdot \alpha^{3j_i} = \alpha^{3j_i}$ applies, functionally at the fourth m-bit wide input of the XOR circuit 24 the always constant value $\alpha^{3j_i}$ is applied. By a simple equivalent transformation, this constant value may thus be considered in the XOR sum which forms the value z(i) by simply inverting the components of z(i) whose corresponding components $\alpha^{3j_i}$ are equal to 1. This may be implemented by the corresponding output rows of the XOR circuit 24 being connected to the corresponding inputs of the NOR circuit 25 via inverters, while the output rows of the XOR circuit 24, whose corresponding components of $\alpha^{3j_i}$ are equal to 0, are directly connected to the corresponding inputs of the NOR circuit 25.

At the 1-bit wide output, the NOR circuit 25 may output the 1-bit wide correction signal $\Delta v_i$.

Figure 3:
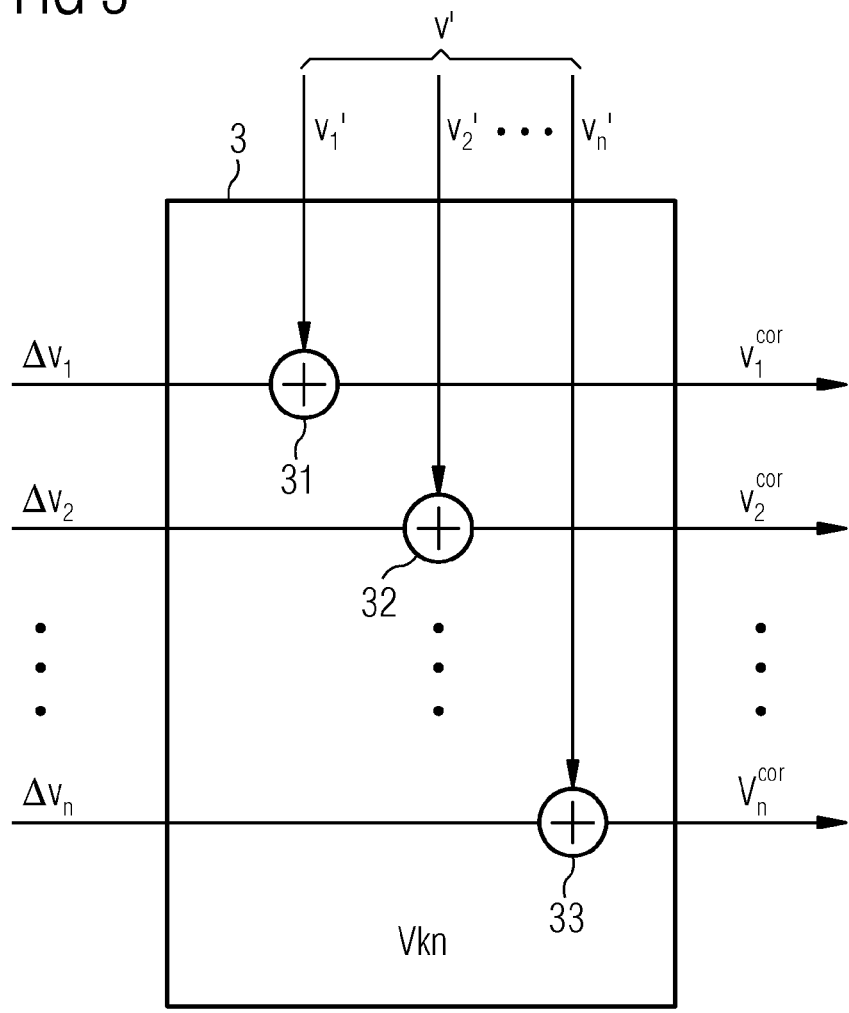
FIG. 3 shows a schematic block diagram of a possible implementation of a combinational circuit configured to combine the correction signals $\Delta v_i$ with the word v' to obtain the error-corrected word $v^{cor}$.

In FIG. 3, one possible implementation of a combinational circuit Vkn 3 is illustrated. It comprises n first binary inputs at which the correction values $\Delta v_1, \ldots, \Delta v_n$ are input which are output by the corresponding subcircuits $SK_1, \ldots SK_n$. The components $v_1', \ldots, v_n'$ of the data word v' to be corrected are applied at further n second binary inputs of the combinational circuit Vkn 3. The corrected values $v_1^{cor}, \ldots, v_n^{cor}$ of the corrected data word $v^{cor}=v_1^{cor}, \ldots, v_n^{cor}$ are output at the n binary outputs of the combinational circuit Vkn 3. For i= 1, ..., n the i-th input of the first n inputs of the circuit Vkn 3 which carries the correction signal $\Delta v_i$ may be connected to a first input of an XOR gate 3$i$ whose second input may be connected to the i-th input of the n second inputs which carries the value $v_i'$ and whose output which carries the corrected signal $v_i^{cor}$ is led out as i-th output of the circuit Vkn 3.

It is clear that the combinational circuit may for example be changed equivalently without changing anything regarding the scope of the disclosure. It is thus for example possible to use inverted correction signals and connect them with XNOR gates instead of XOR gates. It is likewise for example possible to invertedly supply components of the disturbed data word v' to the combinational circuit Vkn and to at least partially implement XNOR gates instead of XOR gates if one of their inputs is currently inverted.

Figure 4A:
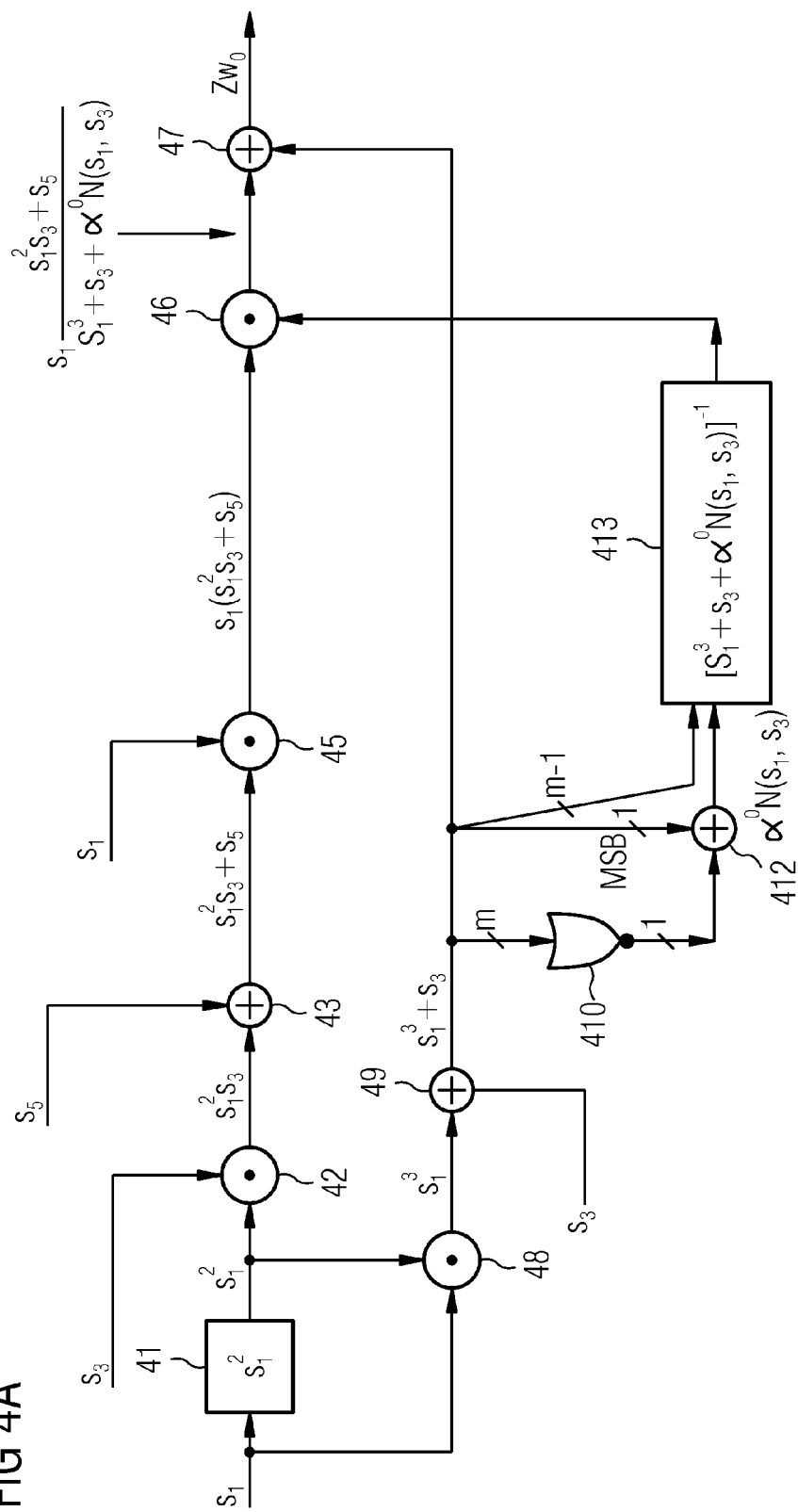

In FIG. 4A a possible implementation of a subcircuit $SZw_0$ for determining an intermediate value $Zw_0$ is illustrated. The subcircuit $SZw_0$ of FIG. 4A is provided to form the intermediate value $Zw_0$ according to a following relation $$Zw_0 = \left(s_1^3 + s_3 + \frac{s_1^3 \cdot s_3 + s_1 \cdot s_5}{s_1^3 + s_3 + \alpha^0 \cdot N(s_1, s_3)}\right),$$

At a first m-bit wide input of the subcircuit $SZw_0$ the syndrome component $s_1$ is applied, at a second m-bit wide input the syndrome component $s_3$ is applied, and at a third also m-bit wide input the syndrome component $s_5$ is applied. At the orbit wide output the intermediate value $Zw_0$ is output. The first input carrying the syndrome component $s_1$ is connected to an m-bit wide input of a squarer 41 and to a first input of a Galois field multiplier 48. The second m-bit wide input which carries the syndrome component $s_3$ is connected to a first input of a Galois field multiplier 42 whose second m-bit wide input is connected to the output of the squarer 41 which carries the value $s_1^2$. The third m-bit wide input which carries the syndrome component $s_5$ is connected to a first input of an XOR circuit 43 whose second m-bit wide input is connected to the output of the Galois field multiplier 42 which carries the value $s_1^2 \cdot s_3$.

The syndrome components $s_1$, $s_3$ and $s_5$ may be provided at the outputs of the syndrome generator Synd 11 in FIG. 1. The XOR circuit 43 may implement a componentwise XOR operation. The m-bitwise output of the XOR circuit 43 connected to a first input of a Galois field multiplier 45 carries the value $s_1^2 \cdot s_3 + s_5$. The second m-bitwise input of the Galois field multiplier 45 may also be connected to the first input of $SZw_0$ which carries the syndrome component $s_1$ and which may also be connected to the input of the squarer 41 and to the first input of the Galois field multiplier 48. The output of the Galois field multiplier 45 which carries the value $s_1(s_1^2 \cdot s_3 + s_5)$ may be connected to a first input of a Galois field multiplier 46.

The output of the Galois field multiplier 48 which carries the signal S1 may be connected to the first input of an XOR circuit 49 whose second m-bit wide input may be connected to the second input of the subcircuit $SZw_0$ carrying the syndrome component $s_3$ wherein this input may also be connected to the first input of the Galois field multiplier 42. Its output which carries the value $s_1^3 + s_3$ may be connected to the m-bit wide input of an NOR circuit 410 with a binary output and connected to a first m-bit wide input of an XOR circuit 47.

The 1-bit wide output of the NOR circuit 410 may carry the value 1 exactly when $s_1^3 + s_3 = 0$ or when $s_1^3 = s_3$ and thus also when $s_1 = s_3 = 0$ applies and thus also $\alpha^0 \cdot N(s_1, s_3) = (1, 0, \ldots, 0)$ applies. Note that $\alpha^0 = (1, 0, 0, \ldots, 0)$ with m bits (see FIG. 4D). The output of the NOR circuit 410 may be connected to a first input of an XOR gate 412 having two binary inputs and one binary output. At the second input of the XOR gate 412 the most significant bit of the value $s_1^3 + s_3$ may be applied. This most significant bit may be inverted exactly when $s_1^3 + s_3 = 0$. In this case it may be set to the value 1. In any other cases it may remain unchanged. The value output by the XOR gate 412, as a most significant bit MSB forms, together with the m−1 least significant bits of the output line of the XOR circuit 49, the value $s_1^3 + s_3 + \alpha^0 \cdot N(s_1, s_3)$ which is applied to the m-bit wide input of an inverter 413 for forming the value which is inverse in the Galois field and which, at its output which may be connected to the second m-bit wide input of the Galois field multiplier 46, may output the value $[s_1^3 + s_3 + \alpha^0 \cdot N(s_1, s_3)]^{-1}$. In one embodiment, the XOR gate 412 may also be replaced by an OR gate having two binary inputs and one binary output, because as described above a connection of the two input values 1 and 1 does not have to be implemented and the OR function and the XOR function are equal for the input values [0, 0], [1, 0], [0, 1]. At its output which may be connected to a second input of the XOR circuit 47 the Galois field multiplier 46 may output the value $$\frac{s_1^3 \cdot s_3 + s_1 \cdot s_5}{s_1^3 + s_3 + \alpha^0 \cdot N(s_1, s_3)}.$$

This value may be applied to the second input of the XOR circuit 47 at whose first m-bit wide input the value $s_1^3 + s_3$ is applied. At its output it may output the intermediate value $Zw_0$ with $$Zw_0 = \left(s_1^3 + s_3 + \frac{s_1^3 \cdot s_3 + s_1 \cdot s_5}{s_1^3 + s_3 + \alpha^0 \cdot N(s_1, s_3)}\right).$$

The subcircuit 413 for inverting the input value in the Galois field may for example be implemented via a table with m inputs and m outputs which may be implemented as an ROM or as a combinational function.

Implementing squarers, Galois field multipliers and inverters is known to a person skilled in the art. In addition, the squarer 41 may either be also implemented as a table with m inputs and m outputs. It is also possible to implement this circuit as a linear circuit. All elements of the considered Galois field in their polynomial representation may be represented as polynomials of the (m−1)-th degree and the squared polynomials may again be determined modulo the modular polynomial as (m−1)-th degree polynomials of the Galois field, whereupon the linear representation directly follows which is still to be described for a concrete embodiment.

Accordingly, the concrete implementations for the Galois field multiplier 42, 45, 46 and 48 may also be derived by multiplying the corresponding polynomials of the operands modulo the modular polynomial which is known to a person skilled in the art and is apart from that still to be described for a concrete Galois field.

In FIG. 4B, one possible implementation of a subcircuit $SZw_1$ for implementing an intermediate value $Zw_1$ is schematically illustrated. The subcircuit $SZw_1$ of FIG. 4B is provided to form the intermediate value $Zw_1$ according to the following relation $$Zw_1 = \left(\frac{s_1^2 \cdot s_3 + s_5}{s_1^3 + s_3 + \alpha^0 \cdot N(s_1, s_3)}\right),$$

At a first m-bit wide input of the subcircuit $SZw_1$ the syndrome component $s_1$ may be applied, at a second m-bit wide input the syndrome component $s_3$ may be applied and at a third also m-bit wide input the syndrome component $s_5$ may be applied. At the m-bit wide output the intermediate value $Zw_1$ may be output. The first input carrying the syndrome component $s_1$ may be connected to an m-bit wide input of a squarer 414 and to a first input of a Galois field multiplier 418. The second m-bit wide input carrying the syndrome component $s_3$ may be connected to a first input of a Galois field multiplier 415 whose second m-bit wide input may be connected to the output of the squarer 414 which may carry the value $s_1^2$. The output of the squarer 414 may be additionally connected to the second input of the Galois field multiplier 418.

The output of the Galois field multiplier 415 may be connected to a first m-bit wide input of the XOR circuit 416 whose second m-bit wide input may be connected to the third m-bit wide circuit input of the circuit $SZw_1$ which may carry the syndrome component $s_5$. The second m-bit wide input of the circuit $SZw_1$ which may carry the syndrome component $s_3$ may be connected to a first input of an XOR circuit 419 whose second m-bit wide input may be connected to the output of the Galois field multiplier 418 which may carry the value $s_1^3$.

The syndrome components $s_1$, $s_3$ and $s_5$ may be provided at the outputs of the syndrome generator Synd 11 in FIG. 1. The XOR circuit 416 may implement a componentwise XOR operation. The m-bitwise output of the XOR circuit 416 which may be connected to a first input of a Galois field multiplier 417 may carry the value $$s_1^2 \cdot s_3 + s_5.$$

The m-bit wide output of the XOR circuit 419 which may carry the value $s_1^3 + s_3$ may be connected to the m-bit wide input of an NOR circuit 420 having a binary output.

The 1-bit wide output of the NOR circuit 420 may carry a "1" exactly when $s_1^3 + s_3 = 0$. This is typically the case when $s_1^3 = s_3$ or when $s_1 = s_3 = 0$ applies. In this case $\alpha^0 \cdot N(s_1, s_3) = (1, 0, \ldots, 0)$ applies. The output of the NOR circuit 420 may be connected to a first input of an OR gate 421 having two binary inputs and one binary output. The most significant bit of the value $s_1^3 + s_3$, which is output by the XOR circuit 419, may be applied to the second input of the OR gate 421. The value output by the OR gate 421, being the most significant bit, at the same time with the m−1 least significant bits of the m bits output by the XOR circuit 419, are applied to the m-bit wide input of an inverter 422. At the input of the inverter 422 the input value $[s_1^3 + s_3 + \alpha^0 \cdot N(s_1, s_3)]$ may be applied. The inverter 422 may form the value $[s_1^3 + s_3 + \alpha^0 \cdot N(s_1, s_3)]^{-1}$ which, in the Galois field, may be the inverse of the input value applied to its input and outputs said inverse at its output. The output of the inverter 411 may be connected to the second m-bit wide input of the Galois field multiplier 417.

At its output the Galois field multiplier 417 outputs the intermediate value $$Zw_1 = \frac{s_1^2 \cdot s_3 + s_5}{s_1^3 + s_3 + \alpha^0 \cdot N(s_1, s_3)}.$$

In FIG. 4B, the most significant bit of the input value $[s_1^3 + s_3 + \alpha^0 \cdot N(s_1, s_3)]$ applied to the input of the inverter 422 may be obtained from the value $s_1^3 + s_3$ output by the XOR circuit 419 using the NOR circuit 420 and the OR gate 421.

In contrast to that, in FIG. 4A the most significant bit of the input value $[s_1^3 + s_3 + \alpha^0 \cdot N(s_1, s_3)]$ applied to the input of the inverter 413 may be obtained from the value $s_1^3 + s_3$ output by the XOR circuit 49 using the NOR circuit 410 and the XOR gate 412.

At both inputs of the XOR gate 412 and the OR gate 421 the pair (1, 1) of input values is typically never applied so that the values output by an OR gate are not different from values output by an XOR gate.

FIG. 4C shows one possible implementation of a subcircuit $SZw_2$ for implementing the intermediate value $Zw_2 = s_1$. It may simply comprise an m-component line 423 connected to the output of the syndrome generator Synd 11 which outputs the syndrome component $s_1$.

FIG. 4D shows one possible implementation of a subcircuit $SZw_3$ for implementing the intermediate value $$Zw_3 = \alpha^0 = \underbrace{(1, 0, \cdots, 0)}_{m}.$$

It may comprise an m-component line whose most significant bit is constantly at the value "1" and whose m−1 least significant components are constantly at the value "0".

Figure 5:
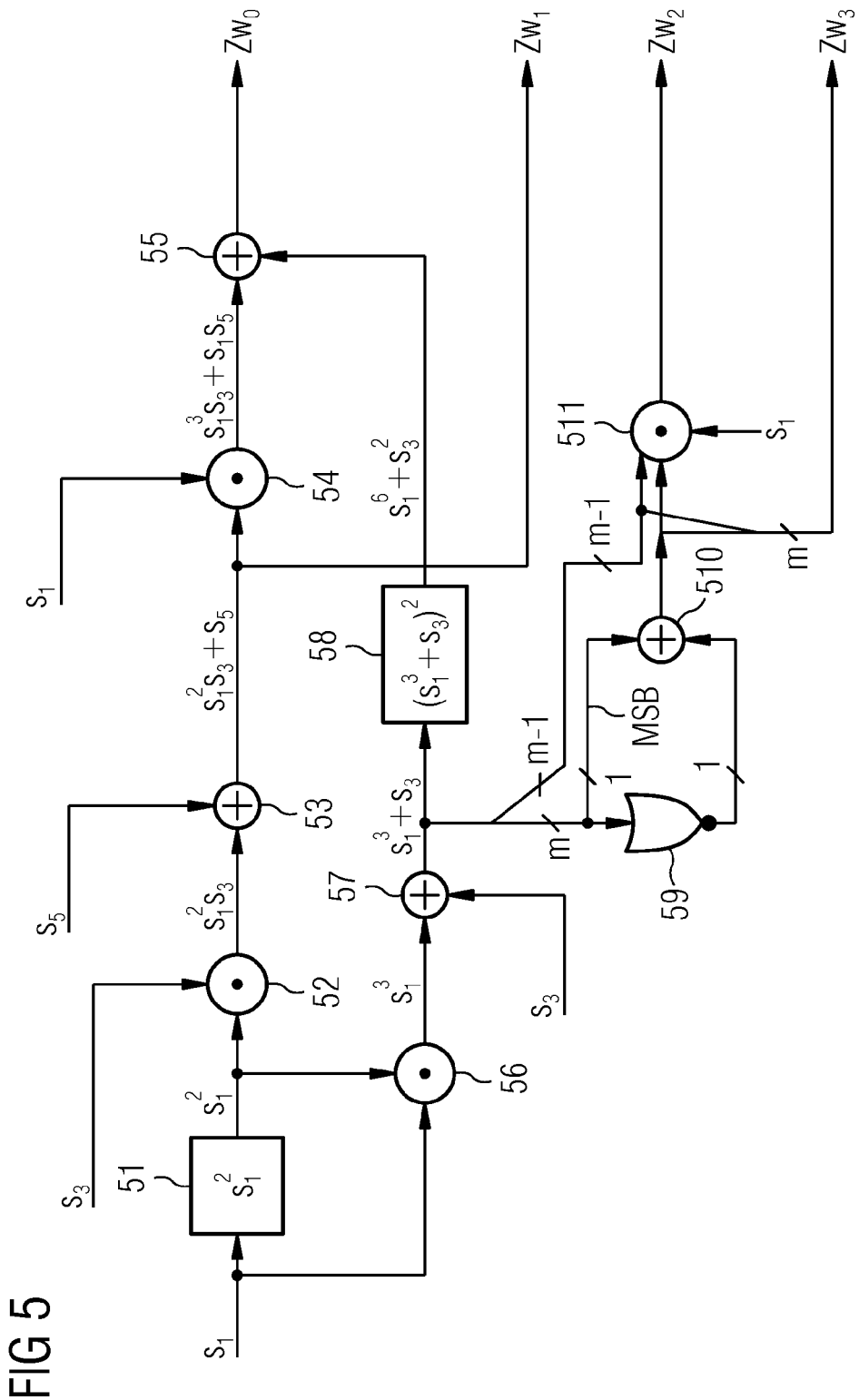
FIG. 5 shows a schematic block diagram of a subcircuit that is configured to provide the intermediate values $Zw_0$, $Zw_1$, $Zw_2$, and $Zw_3$.

In FIG. 5, one embodiment for a joint implementation of the subcircuits $SZw_0$, $SZw_1$, $SZw_2$ and $SZw_3$ for generating the intermediate values $Zw_0$, $Zw_1$, $Zw_2$ and $Zw_3$ is schematically illustrated which determine the intermediate values according to the following relations $$Zw_0 = s_1^6 + s_3^2 + s_1^3 \cdot s_3 + s_1 \cdot s_5,$$

$$Zw_1 = s_1^2 s_3 + s_5,$$

$$Zw_2 = s_1 \cdot [s_1^3 + s_3 + \alpha^0 \cdot N(s_1, s_3)] Zw_3 = s_1^3 + s_3 + \alpha^0 \cdot N(s_1, s_3).$$

The subsyndrome $s_1$ is applied to a first m-bit wide input which may be connected to both, an input of a squarer 51 and also a first input of a Galois field multiplier 56. The output of the squarer 51 is connected both to a first m-bit wide input of a Galois field multiplier 52 and also to the second m-bit wide input of the Galois field multiplier 56. The subsyndrome $s_3$ may be applied to the second m-bit wide input of the Galois field multiplier 52. The output of this Galois field multiplier, which carries the value $s_1^2 \cdot s_3$, may be connected to a first m-bit wide input of an XOR circuit 53 at whose second also m-bit wide input the value $s_5$ of the subsyndrome $s_5$ may be applied. The XOR circuit 53 may perform the componentwise-XOR operation of the m-bit operands applied to its two inputs, so that it may output the value $s_1^2 s_3 + s_5$ at its output. This output may be connected to a first m-bit wide input of a Galois field multiplier 54 and at the same time to the circuit output which may carry the intermediate value $Zw_1$.

The value of the subsyndrome $s_1$ may be applied to the second m-bit wide input of the Galois field multiplier 54. The output of this Galois field multiplier 54, which carries the value $s_1^3 s_3 + s_1 s_5$ may be connected to a first m-bit wide input of an XOR circuit 55.

The output of the Galois field multiplier 56 which carries the value $s_1^3$ may be connected to a first m-bit wide input of an XOR circuit 57 at whose second m-bit wide input the value $s_3$ may be applied. The m-bit wide output of this XOR circuit 57 which carries the value $s_1^3 + s_3$ may be connected to a squarer 58 and into an NOR circuit 59. Apart from that, the most significant bit MSB of the output of the XOR circuit 57 may be connected to a first input of an XOR gate 510 to whose second input the output of the NOR circuit 59 may be connected. The m−1 least significant bits of the output of the XOR circuit 57 and the bit output at the output of the XOR gate 510 may be applied to a first m-bit wide input of a Galois field multiplier 511 at whose second m-bit wide input the value of the subsyndrome $s_1$ may be input and whose output may be connected to the circuit output which may output the intermediate value $Zw_2$.

The output lines of the output of the XOR circuit 57 carrying the m−1 least significant bits and the output of the XOR gate 510 may be connected to the circuit output which outputs the intermediate value $Zw_3$.

The output of the squarer 58 which carries the value $(s_1^3 + s_3)^2 = s_1^6 + s_3^2$ may be connected to the m-bit wide second input of the XOR circuit 55 whose output may be connected to the circuit output which carries the intermediate value $Zw_0$.

Unexpectedly, the expression $s_1^3+s_3+\alpha^0 \cdot N(s_1, s_3)$ may easily be determined on the basis of the expression $s_1^3+s_3$, using the NOR circuit 59 and the XOR gate 510, as it is explained in the following.

$s_1^3+s_3\alpha^0 \cdot N(s_1, s_3)$ is equal to $s_1^3+s_3$ for $s_1^3+s_3 \neq 0$ and equal to $$\alpha^0 = \underbrace{1, 0, \cdots, 0}_{m}{}^T$$

for $s_1^3+s_3=0$.

If $s_1^3+s_3 \neq 0$, then the NOR circuit 59 outputs the value "0" at its 1-bit wide output which may be applied to the second input of the XOR gate 510. The most significant bit MSB of $s_1^3+s_3$ may be input into the first input of the XOR gate 510 and output at the output of this gate unchanged due to the "0" applied to the second input. The unchanged most significant bit and the m−1 least significant bits of $s_1^3+s_3$ form the value $s_1^3+s_3$ which may be applied both to the first input of the Galois field multiplier and also to the circuit output which outputs the value $Zw_3$.

If $s_1^3+s_3=0$ applies, the NOR circuit 59 outputs the value 1 which may be applied to the second input of the XOR gate 510. The most significant bit (MSB) of $s_1^3+s_3$ is equal to 0, just like the further m−1 bits. At the output of the XOR gate 510 thus the value "1" may be output so that on the m input lines of the first input of the Galois field multiplier 511, just like at the circuit output which carries the value $Zw_3$, the value $$\alpha^0 = \underbrace{(1, 0, \cdots, 0)}_{m}{}^T$$

is output.

It is obvious to a person skilled in the art that the circuit may be changed equivalently. It is for example possible to replace the XOR gate 510 by an OR gate without changing the function of the circuit. It is likewise for example possible, instead of the Galois field multiplier 56 and the upstream squarer 51, to use a subcircuit which directly forms the third power $s_1^3$ from $s_1$. It is likewise possible, for example instead of the given signals, to use partially inverted signals and to implement the circuit with different gate libraries.

The subcircuits $SZw_0$, $SZw_1$, $SZw_2$ and $SZw_3$ in FIG. 5 may be partially implemented in a joint manner, which is characterized by the fact that circuit parts may be simultaneously used by several subcircuits and which may be advantageous with respect to the circuit expenditure or complexity.

The subcircuit $SZw_0$ may here comprise the circuit parts 51, 52, 53, 54, 55, 56, 57, 58.

The subcircuit $SZw_1$ may comprise the circuit parts 51, 52, 53 which are all also used for implementing the subcircuit $SZw_0$.

The subcircuit $SZw_2$ may comprise the subcircuits 51, 56, 57, 59, 510, 511, and the subcircuit $SZw_3$ may comprise the circuit parts 51, 56, 57, 59, 510, which are all also used for implementing the subcircuit $SZw_2$.

For a better understanding of the disclosure now circuit parts which may be used for implementing the disclosure are still to be explained for one concrete embodiment.

In this respect, in one embodiment m=5 is selected so that the underlying Galois field is $GF(2^5)=GF(32)$.

The elements of the Galois field $GF(2^5)=GF(32)$ are illustrated in Table 1 in their different forms. The modular polynomial of the considered Galois field is the polynomial $m(x)=1+x^2+x^5$.

TABLE 1

Elements of the $GF(2^5)$ generated by the primitive polynomial $p(x) = 1 + x^2 + x^5$

| Power Representation | Polynomial Representation | Tuple Representation |
|---|---|---|
| 0 | 0 | (00000) |
| $\alpha^0$ | 1 | (10000) |
| $\alpha^1$ | $x^1$ | (01000) |
| $\alpha^2$ | $x^2$ | (00100) |
| $\alpha^3$ | $x^3$ | (00010) |
| $\alpha^4$ | $x^4$ | (00001) |
| $\alpha^5$ | $1 + x^2$ | (10100) |
| $\alpha^6$ | $x^1 + x^3$ | (01010) |
| $\alpha^7$ | $x^2 + x^4$ | (00101) |
| $\alpha^8$ | $1 + x^2 + x^3$ | (10110) |
| $\alpha^9$ | $x^1 + x^3 + x^4$ | (01011) |
| $\alpha^{10}$ | $1 + x^4$ | (10001) |
| $\alpha^{11}$ | $1 + x^1 + x^2$ | (11100) |
| $\alpha^{12}$ | $x^1 + x^2 + x^3$ | (01110) |
| $\alpha^{13}$ | $x^2 + x^3 + x^4$ | (00111) |
| $\alpha^{14}$ | $1 + x^2 + x^3 + x^4$ | (10111) |
| $\alpha^{15}$ | $1 + x^1 + x^2 + x^3 + x^4$ | (11111) |
| $\alpha^{16}$ | $1 + x^1 + x^3 + x^4$ | (11011) |
| $\alpha^{17}$ | $1 + x^1 + x^4$ | (11001) |
| $\alpha^{18}$ | $1 + x^1$ | (11000) |
| $\alpha^{19}$ | $x^1 + x^2$ | (01100) |
| $\alpha^{20}$ | $x^2 + x^3$ | (00110) |
| $\alpha^{21}$ | $x^3 + x^4$ | (00011) |
| $\alpha^{22}$ | $1 + x^2 + x^4$ | (10101) |
| $\alpha^{23}$ | $1 + x^1 + x^2 + x^3$ | (11110) |
| $\alpha^{24}$ | $x^1 + x^2 + x^3 + x^4$ | (01111) |
| $\alpha^{25}$ | $1 + x^3 + x^4$ | (10011) |
| $\alpha^{26}$ | $1 + x^1 + x^2 + x^4$ | (11101) |
| $\alpha^{27}$ | $1 + x^1 + x^3$ | (11010) |
| $\alpha^{28}$ | $x^1 + x^2 + x^4$ | (01101) |
| $\alpha^{29}$ | $1 + x^3$ | (10010) |
| $\alpha^{30}$ | $x^1 + x^4$ | (01001) |

The 31 elements of the Galois field are represented in the first column of Table 1 in lines 2 to 32 for i=0, . . . , 30 in their power representation $\alpha^i$, which may be also called exponential representation The element 0 in the first row of the first column has no power representation. $\alpha$ here is a primitive element of the Galois field.

In the second column the 32 elements of the Galois field are given in their polynomial representation for the modular polynomial $m(x)=1+x^2+x^5$. In the third column the tuple or vector representation is given. The five components of the vector representation correspond to the five coefficients of the powers $x^0$, $x^1$, $x^2$, $x^3$, $x^4$ of the polynomial representation. Thus, for example the vector representation 00101 corresponds to the polynomial $x^2+x^4$ in the 9$^{th}$ row of Table 1.

The corresponding polynomial representation results from the power representation $\alpha^j$ by determining $[x^j \bmod (1+x^2+x^5)]$.

Thus, the polynomial representation of $\alpha^5$ is equal $1+x^2$, as the following applies $$x^5 \bmod (1+x^2+x^5)=1+x^2.$$

Accordingly, the polynomial representation of $\alpha^6$ is equal to $$x^6 \bmod (1+x^2+x^5)=x+x^3,$$

the polynomial representation of $\alpha^7$ is equal to $$x^7 \bmod (1+x^2+x^5)=x^2+x^4$$

and the polynomial representation of $\alpha^8$ is equal to $$x^8 \bmod (1+x^2+x^5)=1+x^2+x^3,$$

as it is given in rows 7, 8, 9 and 10 of Table 1.

The multiplication of two elements of the Galois field may be done in the exponential representation or in the polynomial representation.

If two elements of the Galois field $GF(2^m)=GF(2^5)$ are given in the exponential representation $\alpha^i$ and $\alpha^j$, then their product is $\alpha^i \cdot \alpha^j = \alpha^k$ with $k = i+j$ modulo$(2^m-1) = i+j$ modulo(31).

If the elements of the Galois field to be multiplied exist in their vector representation or in their polynomial representation, their multiplication may be performed by a Galois field multiplier. Although Galois field multipliers are known to a person skilled in the art, for a better understanding of the disclosure the multiplication of two elements in their polynomial representation is to be described for one application example.

In order to multiply two elements with each other the elements of the Galois field $GF(2^m)=GF(2^5)$ are given in their polynomial representation, then the polynomials are to be multiplied directly by each other as usual, and the result is to be determined modulo the modular polynomial.

If, for example, the polynomials $1+x^2+x^3$ and $x+x^3$ are given, their direct multiplication results in $(1+x^2+x^3)(x+x^3) = x+x^4+x^5+x^6$ and because of $x^5 = 1+x^2$ modulo$(1+x^2+x^5)$ and $x^6 = x+x^3$ modulo$(1+x^2+x^5)$, then $x+x^4+x^5+x^6 = x+x^4+1+x^2+x+x^3 = 1+x^2+x^3+x^4$ applies so that for their multiplication in the Galois field the following applies:

$(1+x^2+x^3)(x+x^3) = 1+x^2+x^3+x^4$.

Now the case is described that a first element $a(x)$ with $a(x) = a_4 x^4 + a_3 x^3 + a_2 x^2 + a_1 x + a_0$ and a second element $b(x)$ with $b(x) = b_4 x^4 + b_3 x^3 + b_2 x^2 + b_1 x + b_0$ are multiplied (in the Galois field $GF(2^5)$ with the modular polynomial $m(x) = x^6 + x^2 + 1$).

By directly multiplying the polynomials $a(x)$ and $b(x)$ an $8^{th}$ degree polynomial results and by determining $x^5$, $x^6$, $x^7$ and $x^8$ modulo$(1+x^2+x^5)$ to be $1+x^2$, $x+x^3$, $x^2+x^4$ and $1+x^2+x^3$, respectively, it may be directly calculated that a fourth degree polynomial results and that the following applies $c_4 x^4 + c_3 x^3 + c_2 x^2 + c_1 x^1 + c_0 = a(x) \cdot b(x) \bmod m(x) ==$
$(a_0 b_4 + a_1 b_3 + a_2 b_2 + a_3 b_1 + a_3 b_4 + a_4 b_0 + a_4 b_3) x^4 +$
$(a_0 b_3 + a_1 b_2 + a_2 b_1 + a_2 b_4 + a_3 b_0 + a_3 b_3 + a_4 b_2 + a_4 b_4) x^3 +$
$(a_0 b_2 + a_1 b_1 + a_1 b_4 + a_2 b_0 + a_2 b_3 + a_3 b_2 + a_3 b_4 + a_4 b_1 +$
$a_4 b_3 + a_4 b_4) x^2 + (a_0 b_1 + a_1 b_0 + a_2 b_4 + a_3 b_3 + a_4 b_2) x^1 +$
$(a_0 b_0 + a_1 b_4 + a_2 b_3 + a_3 b_2 + a_4 b_1 + a_4 b_4)$ This relationship is implemented by a Galois field multiplier with five first binary inputs, five second binary inputs and five binary outputs which is to be described in the following.

The binary values $a_0$, $a_1$, $a_2$, $a_3$, $a_4$ are applied to the first five inputs of the Galois field multiplier. The binary values $b_0$, $b_1$, $b_2$, $b_3$, $b_4$ are applied and to the second five inputs. The resulting values $c_0$, $c_1$, $c_2$, $c_3$, $c_4$ with $(a_0 b_0 + a_1 b_4 + a_2 b_3 + a_3 b_2 + a_4 b_1 + a_4 b_4) = c_0$, (32)

$(a_0 b_1 + a_1 b_0 + a_2 b_4 + a_3 b_3 + a_4 b_2) = c_1$ (33)

$(a_0 b_2 + a_1 b_1 + a_1 b_4 + a_2 b_0 + a_2 b_3 + a_3 b_2 + a_3 b_4 + a_4 b_1 + a_4 b_3 + a_4 b_4) = c_2$ (34)

$(a_0 b_3 + a_1 b_2 + a_2 b_1 + a_2 b_4 + a_3 b_0 + a_3 b_3 + a_4 b_2 + a_4 b_4) = c_3$ (35)

$(a_0 b_4 + a_1 b_3 + a_2 b_2 + a_3 b_1 + a_3 b_4 + a_4 b_0 + a_4 b_3) = c_4$ (36)

are output at the five binary outputs.

Here, "+" designates the addition modulo 2 or the XOR operation.

The implementation of equations 32 to 36 and thus the implementation of a Galois field multiplier, for example by AND and XOR gates, is no difficulty for a person skilled in the art and is thus not to be explained any further. Conventionally, a person skilled in the art may use a synthesis tool.

If an element of the Galois field is squared, it may be multiplied by itself. If in the polynomial representation an element is given as the polynomial $a(x) = a_0 + a_1 x^1 + a_2 x^2 + a_3 x^3 + a_4 x^4$ the following applies, $(a(x))^2 \bmod m(x) = [a_0 + a_1 x^2 + a_2 x^4 + a_3 x^6 + a_4 x^8] \bmod(1+x^2+x^5) = (a_2) x^4 + (a_3 + a_4) x^3 + (a_1 + a_4) x^2 + a_3 x^1 + (a_0 + a_4)$.

Squaring an element in the Galois field $GF(2^5)$ may accordingly be implemented with a squarer having five binary inputs and five binary outputs. At its five binary inputs the binary values $a_0$, $a_1$, $a_2$, $a_3$, $a_4$ may be input and at its 5 binary outputs the binary values $d_0$, $d_1$, $d_2$, $d_3$, $d_4$ may be output, wherein the following applies $a_0 + a_4 = d_0$ (37)

$a_3 = d_1$ (38)

$a_1 + a_4 = d_2$ (39)

$a_3 + a_4 = d_3$ (40)

$a_2 = d_4$ (41)

and "+" again designates the addition modulo 2 or the XOR operation.

For implementing a squarer in the Galois field $GF(2^5)$ with the modular polynomial $m(x) = 1+x^2+x^5$ then only linear equations 37 to 41 are to be implemented, which is no difficulty for a person skilled in the art and is not to be described any further.

It is to be described again with reference to the example of the Galois field $GF(2^5)$ how the third power of an element may be determined which is described in its polynomial representation.

If the third power $(a(x))^3$ of a polynomial $a(x) = a_0 + a_1 x^1 + a_2 x^2 + a_3 x^3 + a_4 x^4$ is determined modulo the modular polynomial $m(x) = 1+x^2+x^5$, the following applies $(a(x))^3 \bmod m(x) =$
$(a_0 a_2 + a_0 a_4 + a_1 a_2 + a_1 a_3 + a_1 a_4 + a_2 a_3 + a_2 a_4 + a_3 + a_3 a_4) x^4 +$
$(a_0 a_4 + a_1 + a_2 + a_2 a_3 + a_2 a_4 + a_3 + a_4) x^3 +$
$(a_0 a_1 + a_0 a_2 + a_0 a_4 + a_1 a_2 + a_2 a_4 + a_3 a_4 + a_4) x^2 +$
$(a_0 a_1 + a_0 a_3 + a_2 + a_3 + a_3 a_4 + a_4) x^1 +$
$(a_0 + a_0 a_4 + a_1 a_2 + a_1 a_3 + a_2 a_3)$ Forming the third power of an element in the Galois field $GF(2^5)$ may be implemented accordingly with a third power generator having five binary inputs and five binary outputs. At its five binary inputs the binary values $a_0$, $a_1$, $a_2$, $a_3$, $a_4$ are input and at its five binary outputs the five binary values $f_0$, $f_1$, $f_2$, $f_3$, $f_4$ are output, wherein $$f_0 = a_0 + a_0 a_4 + a_1 a_2 + a_1 a_3 + a_2 a_3 \tag{42}$$

$$f_1 = a_0 a_1 + a_0 a_3 + a_2 + a_3 + a_3 a_4 + a_4 \tag{43}$$

$$f_2 = a_0 a_1 + a_0 a_2 + a_0 a_4 + a_1 a_2 + a_2 a_4 + a_3 a_4 + a_4 \tag{44}$$

$$f_3 = a_0 a_4 + a_1 + a_2 + a_2 a_3 + a_2 a_4 + a_3 + a_4 \tag{45}$$

$$f_4 = a_0 a_2 + a_0 a_4 + a_1 a_2 + a_1 a_3 + a_1 a_4 + a_2 a_3 + a_2 a_4 + a_3 + a_3 a_4 \tag{46}$$

For implementing a third power generator, here in the Galois field $GF(2^5)$ with the modular polynomial $m(x) = 1 + x^2 + x^5$, only equations 42 to 46 are to be implemented which is no difficulty for a person skilled in the art and which is not to be described any further.

Alternatively, a person skilled in the art will also consider to implement a third power generator from a squarer and a downstream Galois field multiplier.

In special implementations of the disclosure an inverter may be used. With reference to the example of the Galois field $GF(2^5)$, Table 2 schematically illustrates how the functioning of a corresponding inverter may be represented as a table of values.

TABLE 2

Table of values of an inverter for $GF(2^5)$

| $\alpha^i$ | | $(\alpha^i)^{-1}$ | |
|---|---|---|---|
| Power Representation | Tuple Representation | Power Representation | Tuple Representation |
| $\alpha^0$ | (10000) | $\alpha^0$ | (10000) |
| $\alpha^1$ | (01000) | $\alpha^{30}$ | (01001) |
| $\alpha^2$ | (00100) | $\alpha^{29}$ | (10010) |
| $\alpha^3$ | (00010) | $\alpha^{28}$ | (01101) |
| $\alpha^4$ | (00001) | $\alpha^{27}$ | (11010) |
| $\alpha^5$ | (10100) | $\alpha^{26}$ | (11101) |
| $\alpha^6$ | (01010) | $\alpha^{25}$ | (10011) |
| $\alpha^7$ | (00101) | $\alpha^{24}$ | (01111) |
| $\alpha^8$ | (10110) | $\alpha^{23}$ | (11110) |
| $\alpha^9$ | (01011) | $\alpha^{22}$ | (10101) |
| $\alpha^{10}$ | (10001) | $\alpha^{21}$ | (00011) |
| $\alpha^{11}$ | (11100) | $\alpha^{20}$ | (00110) |
| $\alpha^{12}$ | (01110) | $\alpha^{19}$ | (01100) |
| $\alpha^{13}$ | (00111) | $\alpha^{18}$ | (11000) |
| $\alpha^{14}$ | (10111) | $\alpha^{17}$ | (11001) |
| $\alpha^{15}$ | (11111) | $\alpha^{16}$ | (11011) |
| $\alpha^{16}$ | (11011) | $\alpha^{15}$ | (11111) |
| $\alpha^{17}$ | (11001) | $\alpha^{14}$ | (10111) |
| $\alpha^{18}$ | (11000) | $\alpha^{13}$ | (00111) |
| $\alpha^{19}$ | (01100) | $\alpha^{12}$ | (01110) |
| $\alpha^{20}$ | (00110) | $\alpha^{11}$ | (11100) |
| $\alpha^{21}$ | (00011) | $\alpha^{10}$ | (10001) |
| $\alpha^{22}$ | (10101) | $\alpha^9$ | (01011) |
| $\alpha^{23}$ | (11110) | $\alpha^8$ | (10110) |
| $\alpha^{24}$ | (01111) | $\alpha^7$ | (00101) |
| $\alpha^{25}$ | (10011) | $\alpha^6$ | (01010) |
| $\alpha^{26}$ | (11101) | $\alpha^5$ | (10100) |
| $\alpha^{27}$ | (11010) | $\alpha^4$ | (00001) |
| $\alpha^{28}$ | (01101) | $\alpha^3$ | (00010) |
| $\alpha^{29}$ | (10010) | $\alpha^2$ | (00100) |
| $\alpha^{30}$ | (01001) | $\alpha^1$ | (01000) |

In the first column of Table 2 all $2^5 - 1$ values $\alpha^i$, $i = 0, \ldots, 30$ of the Galois field $GF(2^5)$ are entered in the exponential representation. The 0-element 0 of the Galois field is not entered. It has no inverse element.

The second column contains the element illustrated in the first column in its tuple representation as a binary 5-tuple. This representation is simply read from Table 1. The third column of Table 2 contains the inverse element of the element illustrated in the first column in its exponential representation and the fourth column contains the inverse element represented in the third column in its tuple representation as a binary 5-tuple. This representation is simply read off with the help of Table 1.

If the element represented in the first column is multiplied with the corresponding inverse element of the third column, $\alpha^0 = 1$ results. For the sum of the exponents of an element and the associated inverse element it applies that it is modulo 31 equal 0. The exponent of the inverse element only has to be determined so that the sum of the exponent of the element of the first column and the element of the third column is equal 31 or (in the first row) equal 0.

If, for example, the $10^{th}$ row of Table 2 is considered, the inverse element $\alpha^{22}$ is associated with the element $\alpha^9$, and for the corresponding exponents $22 + 9 = 31$ applies. If, for example, the first row of Table 2 is considered, the inverse element $\alpha^0$ is associated with the element $\alpha^0$ and for the corresponding exponents the following applies $0 + 0 = 0$. If the input value of the inverter just like the output value is given as a 5-tuple in the respective tuple representation, a table of values for the binary implementation of the inverter is obtained by allocating the corresponding tuples of the fourth column to the 5-tuples of the second column. Here, the 5-tuples of the second column are the input values and the tuples of the fourth column are the output values of the inverter. Thus, for example, the output tuple 10101 is associated with the input tuple 01011 (in row 10).

The inverter may then be simply an implementation of the table of values determined this way. As the implementation of a table of values as a combinational circuit is not difficult for a person skilled in the art, this implementation is not to be described any further.

For one embodiment, now the implementation of a constant multiplier is to be described as it may be used in a subcircuit $SK_i$ 13i of FIG. 2. As an example, the constant multiplier 22 for $j_i = 20$ is considered which multiplies the intermediate value $Zw_2$ with $\alpha^{2j_i}$. As $2 j_i = 2 \cdot 20 = 40 = 9$ modulo 31 applies, the intermediate value $Zw_2$ is multiplied by $\alpha^9$.

In the polynomial representation the intermediate value $Zw_2$ may be represented as follows $$Zw_2(x) = Zw_2^4 x^4 + Zw_2^3 x^3 + Zw_2^2 x^2 + Zw_2^1 x + Zw_2^0.$$

In the polynomial representation, $\alpha^9$ according to Table 1 has the following representation $$\alpha^9(x) = x^4 + x^3 + x,$$

and the modular polynomial $m(x)$ of the Galois field $GF(2^5)$ is $$m(x) = x^5 + x^2 + 1.$$

It is possible to first of all directly multiply the fourth degree polynomials $Zw_2(x)$ and $\alpha^9(x)$. Then, an eighth degree polynomial is obtained. If then the powers $x^5$, $x^6$, $x^7$, $x^8$ are replaced by $1 + x^2$, by $x + x^3$, by $x^2 + x^4$, and by $x^3 + x^5 = x^3 + 1 + x^2$, respectively, while observing modulo $m(x) = 1 + x^2 + x^5$, then in the polynomial representation $g(x) = Zw_2(x) \cdot \alpha^9(x)$ the following results $$g(x) = g_4 x^4 + g_3 x^3 + g_2 x^2 + g_1 x + g_0 = Zw_2(x) \cdot \alpha^9(x) \bmod m(x) = (Zw_2^0 + Zw_2^1 + Zw_2^4) x^4 + (Zw_2^0 + Zw_2^3 + Zw_2^4) x^3 + (Zw_2^2 + Zw_2^3 + Zw_2^4) x^2 + (Zw_2^0 + Zw_2^2 + Zw_2^3) x^1 + (Zw_2^1 + Zw_2^2)$$

as may be directly calculated.

The corresponding constant multiplier then comprises 5 binary inputs at which the coefficients $Zw_2^0$, $Zw_2^1$, $Zw_2^2$, $Zw_2^3$, $Zw_2^4$ of the polynomial $Zw_2(x)$ are input and it comprises five binary outputs at which the coefficients $g_0$, $g_1$, $g_2$, $g_3$, $g_4$ of the polynomial $g(x)$ are output. These coefficients $g_0$, $g_1$, $g_2$, $g_3$, $g_4$ may be determined from the coefficients of the polynomial $Zw_2(x)$ according to the following relation $$Zw_2^1 + Zw_2^2 = g_0,$$

$$Zw_2^0 + Zw_2^2 + Zw_2^3 = g_1,$$

$$Zw_2^2 + Zw_2^3 + Zw_2^4 = g_2,$$

$$Zw_2^0 + Zw_2^3 + Zw_2^4 = g_3,$$

$$Zw_2^0 + Zw_2^1 + Zw_2^4 = g_4.$$

A person skilled in the art will implement the relationships between the inputs and the outputs of the described constant multiplier for example by XOR operations or by other suitable operations.

For one embodiment now the functioning of the error correction is to be explained. Again the Galois field $GF(2^5)$ is considered. As H matrices exemplarily the matrices $$H_1 = [\alpha^0 \alpha^1 \alpha^3 \alpha^2 \alpha^4 \alpha^5 \alpha^6 \alpha^7 \alpha^8 \alpha^9 \alpha^{10} \alpha^{11} \alpha^{12} \alpha^{13} \alpha^{14} \alpha^{15} \alpha^{16} \alpha^{17} \alpha^{18} \alpha^{19} \alpha^{20} \alpha^{21} \alpha^{22}]$$

$$H_3 = [\alpha^0 \alpha^3 \alpha^6 \alpha^9 \alpha^{12} \alpha^{15} \alpha^{18} \alpha^{21} \alpha^{24} \alpha^{27} \alpha^{30} \alpha^2 \alpha^5 \alpha^8 \alpha^{11} \alpha^{14} \alpha^{17} \alpha^{20} \alpha^{23} \alpha^{26} \alpha^{29} \alpha^1 \alpha^4]$$

$$H_5 = [\alpha^0 \alpha^5 \alpha^{10} \alpha^{15} \alpha^{20} \alpha^{25} \alpha^{30} \alpha^4 \alpha^9 \alpha^{14} \alpha^{19} \alpha^{24} \alpha^{29} \alpha^3 \alpha^8 \alpha^{13} \alpha^{18} \alpha^{23} \alpha^{28} \alpha^2 \alpha^7 \alpha^{12} \alpha^{17}]$$

are to be used.

If also the total parity is considered, the matrix $H_P$ with $$H_P = [1111111111111111111111]$$

may be added. In the considered embodiment an H matrix is considered which is put together only from submatrices $H_1$, $H_3$ and $H_5$.

By using the vector representation of the elements $\alpha^j$ according to Table 1, for $H_1$, $H_3$ and $H_5$ the following results $$H_1 = \begin{bmatrix} 10000100101100111110001 \\ 01000010010110011111000 \\ 00010101100111110001101 \\ 00100010110011111000110 \\ 00001001011001111100011 \end{bmatrix}$$

$$H_3 = \begin{bmatrix} 10000110010011111011100 \\ 00111110111000101011010 \\ 00001100100111110111000 \\ 01111101110001010110100 \\ 00100101101000011001001 \end{bmatrix}$$

$$H_5 = \begin{bmatrix} 11110100010010101100001 \\ 00100010101100001110011 \\ 01101000011100110111110 \\ 00101100110111110100010 \\ 00110111110100010010101 \end{bmatrix}$$

As the H matrix comprises 23 columns the code comprises the length n=23. As the H matrix comprises 15 rows it comprises 15 check bits and thus 8 data bits.

As an example, the error correction for a 1-bit error in the $12^{th}$ bit is to be explained. The associated error syndrome is then determined by the error vector e with $$e = (00000000000100000000000)$$

The syndrome generator Synd 11 outputs the components $s_1$, $s_3$, $s_5$ of the error syndrome, wherein $$H_1 \cdot e = s_1 = \alpha^{11} = (11100)^T,$$

$$H_3 \cdot e = s_3 = \alpha^2 = (00100)^T,$$

$$H_5 \cdot e = s_5 = \alpha^{24} = (01111)^T$$

applies. The error syndrome $s = s_1, s_3, s_5$ is equal to the $12^{th}$ column of the H matrix $$H = \begin{pmatrix} H_1 \\ H_3 \\ H_5 \end{pmatrix}.$$

The case is considered in which from the components of the error syndrome the intermediate values according to the circuitry of FIG. 5 are formed.

The subcircuits $SZw_0$, $SZw_1$, $SZw_2$, $SZw_3$ of FIG. 5 are configured so that the subcircuits $SZw_0$, $SZw_1$, $SZw_2$, and $SZw_3$, depending on the subsyndromes $s_1$, $s_3$, $s_5$, provide the intermediate values $$Zw_0 = s_1^6 + s_3^2 + s_1^3 \cdot s_3 + s_1 \cdot s_5,$$

$$Zw_1 = s_1 s_3 + s_5,$$

$$Zw_2 = s_1 \cdot [s_1^3 + s_3 + \alpha^0 \cdot N(s_1, s_3)]$$

$$Zw_3 = s_1^3 + s_3 + \alpha^0 \cdot N(s_1, s_3)$$

wherein $$N(s_1, s_3) = \overline{r_1 \vee r_2 \vee \ldots \vee r_m}$$

and $$(r_1, r_2, r_3, r_4, r_5) = s_1^3 + s_3 = (\alpha^{11})^3 + \alpha^2 = \alpha^{33} + \alpha^2 = \alpha^2 + \alpha^2 = 0$$

apply. Thus, the following applies $$N(s_1, s_3) = \overline{r_1 \vee r_2 \vee r_3 \vee r_4 \vee r_5} = \overline{0 \vee 0 \vee 0 \vee 0 \vee 0} = \overline{0} = 1$$

The intermediate values $Zw_i$ output at the circuit outputs of the subcircuit of FIG. 5 may then be determined for $s_1 = \alpha^{11}$, $s_3 = \alpha^2$, $s_5 = \alpha^{24}$ as follows:

$$Zw_0 = s_1^6 + s_3^2 + s_1^3 \cdot s_3 + s_1 \cdot s_5 = (\alpha^{11})^6 + (\alpha^2)^2 + (\alpha^{11})^3 \cdot \alpha^2 + \alpha^{11} \cdot \alpha^{24} = \alpha^{66} + \alpha^4 + \alpha^{33} \cdot \alpha^2 + \alpha^{11} \cdot \alpha^{24} = \alpha^{66} + \alpha^4 + \alpha^{35} + \alpha^{35} = \alpha^4 + \alpha^4 + \alpha^4 + \alpha^4 = 0$$

$$Zw_1 = s_1^2 \cdot s_3 + s_5 = (\alpha^{11})^2 \cdot \alpha^2 + \alpha^{24} = \alpha^{22} \cdot \alpha^2 + \alpha^{24} = \alpha^{24} + \alpha^{24} = 0$$

$$Zw_2 = s_1 \cdot [s_1^3 + s_3 + \alpha^0 \cdot N(s_1, s_3)] = \alpha^{11} \cdot [(\alpha^{11})^3 + \alpha^2 + \alpha^0 \cdot N(s_1, s_3)] = \alpha^{11} \cdot [\alpha^{33} + \alpha^2 + \alpha^0 \cdot 1] = \alpha^{11} \cdot [\alpha^{33} + \alpha^2 + \alpha^0] = \alpha^{11} \cdot [\alpha^2 + \alpha^2 + \alpha^0] = \alpha^{11} \cdot \alpha^0 = \alpha^{11}$$

$$Zw_3 = s_1^3 + s_3 + \alpha^0 \cdot N(s_1, s_3) = (\alpha^{11})^3 + \alpha^2 + \alpha^0 \cdot N(s_1, s_3) = \alpha^{33} + \alpha^2 + \alpha^0 \cdot 1 = \alpha^{33} + \alpha^2 + \alpha^0 = \alpha^2 + \alpha^2 + \alpha^0 = \alpha^0$$

The subcircuit $SK_i$ according to FIG. 2 may provide the 5 bit wide value $z(12)=z_1^{12}, z_2^{12}, z_3^{12}, z_4^{12}, z_5^{12}$ for i=12 and thus $j_i=11$ using the constant multipliers 21, 22, 23 and the XOR circuit 24 according to the following relation $$Z(12)=(z_1^{12},z_2^{12},z_3^{12},z_4^{12},z_5^{12})=Zw_3 \cdot \alpha^{3(11)}+Zw_2 \cdot \alpha^{2(11)}+Zw_1 \cdot \alpha^{11}+Zw_0.$$

As $Zw_0=0$, $Zw_1=0$, $Zw_2=\alpha^{11}$, $Zw_3=\alpha^0$ the following results $$(z_1^{12}, z_2^{12}, z_3^{12}, z_4^{12}, z_5^{12}) = Zw_3 \cdot \alpha^{3 \cdot 11} +$$
$$Zw_2 \cdot \alpha^{2 \cdot 11} + Zw_1 \cdot \alpha^{11} + Zw_0 =$$
$$= \alpha^0 \cdot \alpha^{33} + \alpha^{11} \cdot \alpha^{22} + 0 \cdot \alpha^{11} + 0 =$$
$$= \alpha^{33} + \alpha^{33}$$
$$= \alpha^2 + \alpha^2$$
$$= (0, 0, 0, 0, 0).$$

The NOR circuit 25 may provide the value $\Delta v_{12}$, $$\Delta v_{12} = \overline{z_1^{12} \vee z_2^{12} \vee z_3^{12} \vee z_4^{12} \vee z_5^{12}} =$$
$$\overline{0 \vee 0 \vee 0 \vee 0 \vee 0} = \overline{0} = 1,$$

so that the error in the $12^{th}$ bit is corrected.

No further bits are corrected as $z(i) \neq 0$ results for all $i \neq 12$ and thus $\Delta v_i = 0$.

Consequently, for example for i=7 and thus $j_i=6$ using the already determined values $Zw_0=0$, $Zw_1=0$, $Zw_2=\alpha^{11}$, $Zw_3=\alpha^0$ by a direct calculation the following results:

$$(z_1^7 z_2^7 z_3^7 z_4^7 z_5^7) = Zw_3 \cdot \alpha^{3 \cdot 6} + Zw_2 \cdot \alpha^{2 \cdot 6} + Zw_1 \cdot \alpha^6 + Zw_0 =$$
$$= \alpha^0 \cdot \alpha^{18} + \alpha^{11} \cdot \alpha^{12} + 0 \cdot \alpha^6 + 0 =$$
$$= \alpha^{18} + \alpha^{23}$$
$$= (11000)^T + (11110)^T$$
$$= (00110)^T$$
$$= \alpha^{20}$$
$$\neq 0$$

$$\Delta v_7 = \overline{z_1^7 \vee z_2^7 \vee z_3^7 \vee z_4^7 \vee z_5^7}$$
$$= \overline{0 \vee 0 \vee 1 \vee 1 \vee 0}$$
$$= \overline{1} = 0.$$

It was thus illustrated for the example of the $7^{th}$ bit that this bit is not corrected when a 1-bit error exists in another bit, here in the $12^{th}$ bit. It can be shown analogously for the other bits for the considered embodiment, most simply by direct calculation, that no correction takes place either.

The functioning of the disclosure is now to be explained for the example of a 2-bit error in the $5^{th}$ and $17^{th}$ bit.

The associated error syndrome is then determined by the error vector e with $$e=(0000100000000001000000)$$

and the H matrix $$H = \begin{pmatrix} H_1 \\ H_3 \\ H_5 \end{pmatrix}$$

into $$H_1 \cdot e = s_1 = \alpha^4 + \alpha^{16} = (00001)^T + (11011)^T = (11010)^T = \alpha^{27}$$

$$H_3 \cdot e = s_3 = \alpha^{12} + \alpha^{17} = (01110)^T + (11011)^T = (10111)^T = \alpha^{14}$$

$$H_5 \cdot e = s_5 = \alpha^{20} + \alpha^{18} = (00110)^T + (11000)^T = (11110)^T = \alpha^{23}$$

by the syndrome generator Synd 11.

In contrast to a 1-bit error where $s_1^3 + s_3 = 0$ and $N(s_1, s_3)=1$, here $$(r_1,r_2,r_3,r_4,r_5)=s_1^3+s_3=(\alpha^{27})^3+\alpha^{14}=\alpha^{81}+\alpha^{14}=\alpha^{19}+\alpha^{14}=(01100)^T+(10111)^T=(11011)^T=\alpha^{16} \neq 0$$

and $$N(s_1,s_3)=\overline{r_1 \vee r_2 \vee r_3 \vee r_4 \vee r_5} =$$
$$\overline{1 \vee 1 \vee 0 \vee 1 \vee 1} = \overline{1} = 0.$$

From the syndrome values $s_1 = \alpha^{27}$, $s_3 = \alpha^{14}$, $s_5 = \alpha^{23}$ the intermediate values $Zw_0, Zw_1, Zw_2, Zw_3$ are determined to be $$Zw_0=s_1^6+s_3^2+s_1^3 \cdot s_3+s_1 \cdot s_5=(\alpha^{27})^6+(\alpha^{14})^2+(\alpha^{27})^3 \cdot \alpha^{14}+\alpha^{27} \cdot \alpha^{23}=\alpha^{162}+\alpha^{28}+\alpha^{81} \cdot \alpha^{14}+\alpha^{27} \cdot \alpha^{23}=\alpha^{162}+\alpha^{28}+\alpha^{95}+\alpha^{50}=\alpha^7+\alpha^{28}+\alpha^2+\alpha^{19}=(00101)^T+(01101)^T+(00100)^T+(01100)^T=(00000)^T=0$$

$$Zw_1=s_1^2 \cdot s_3+s_5=(\alpha^{27})^2 \cdot \alpha^{14}+\alpha^{23}=\alpha^{54} \cdot \alpha^{14}+\alpha^{23}=\alpha^{68}+\alpha^{23}=\alpha^6+\alpha^{23}=(01010)^T+(11110)^T=(10100)^T=\alpha^5$$

$$Zw_2=s_1 \cdot [s_1^3+s_3+\alpha^0 \cdot N(s_1,s_3)]=\alpha^{27} \cdot [(\alpha^{27})^3+\alpha^{14}+\alpha^0 \cdot N(s_1,s_3)]=\alpha^{27} \cdot [\alpha^{81}+\alpha^{14}+\alpha^0 \cdot 0]=\alpha^{27} \cdot [\alpha^{19}+\alpha^{14}]=\alpha^{27} \cdot \alpha^{19}=\alpha^{27} \cdot \alpha^{14}=\alpha^{46}+\alpha^{41}=\alpha^{15}+\alpha^{10}=(11111)^T+(10001)^T=(01110)^T=\alpha^{12}$$

$$Zw_3=s_1^3+s_3+\alpha^0 \cdot N(s_1,s_3)=(\alpha^{27})^3+\alpha^{14}+\alpha^0 \cdot N(s_1,s_3)=\alpha^{81}+\alpha^{14}+\alpha^0 \cdot 0=\alpha^{19}+\alpha^{14}=(01100)^T+(10111)^T=(11011)^T=\alpha^{16}$$

by the circuitry of FIG. 5.

The subcircuit $SK_i$ 2 is implemented in FIG. 2 so that the XOR circuit 24 outputs the value z(i), $$z(i)=(z_1^i z_2^i z_3^i z_4^i z_5^i)=Zw_3 \cdot \alpha^{3ji}+Zw_2 \cdot \alpha^{2ji}+Zw_1 \cdot \alpha^{ji}+Zw_0$$

at its here m=5 bit wide output.

For i=5, $j_i=4$, $Zw_0=0$, $Zw_1=\alpha^5$, $Zw_2=\alpha^{12}$, $Zw_3=\alpha^{16}$: the XOR circuit 24 outputs $$z(5)=(z_1^5 z_2^5 z_3^5 z_4^5 z_5^5)=Zw_3 \cdot +^{3 \cdot 4}+Zw_2 \cdot \alpha^{2 \cdot 4}+Zw_1 \cdot \alpha^4+Zw_0=\alpha^{16} \cdot \alpha^{12}+\alpha^{12} \cdot \alpha^8+\alpha^5 \cdot \alpha^4+0=\alpha^{28}+\alpha^{20}+\alpha^9=(01101)^T+(00110)^T+(01011)^T=(00000)^T=0$$

and the NOR circuit 25 forms the correction value $$\Delta v_5=\overline{z_1^5 \vee z_2^5 \vee z_3^5 \vee z_4^5 \vee z_5^5} = \overline{0 \vee 0 \vee 0 \vee 0 \vee 0} = \overline{0}=1.$$

at its output.

For i=17, $j_i=16$, $Zw_0=0$, $Zw_1=\alpha^5$, $Zw_2=\alpha^{12}$, $Zw_3=\alpha^{16}$: the XOR circuit 24 outputs $$z(17)=(z_1^{17} z_2^{17} z_3^{17} z_4^{17} z_5^{17})=Zw_3 \cdot \alpha^{3 \cdot 16}+Zw_2 \cdot \alpha^{2 \cdot 16}+Zw_1 \cdot \alpha^{16}+Zw_0=\alpha^{16} \cdot \alpha^{48}+\alpha^{12} \cdot \alpha^{32}+\alpha^5 \cdot \alpha^{16}+0=\alpha^{64}+\alpha^{44}+\alpha^{21}=\alpha^2+\alpha^{13}+\alpha^{21}=(00100)^T+(00111)^T+(00011)^T=(00000)^T=0$$

and the NOR circuit 25 forms the correction value $$\Delta v_{17} = \overline{\bar{z}_1^{17} \vee \bar{z}_2^{17} \vee \bar{z}_3^{17} \vee \bar{z}_4^{17} \vee \bar{z}_5^{17}} = \overline{0 \vee 0 \vee 0 \vee 0 \vee 0} = \overline{0} = 1.$$

No further bits are corrected. Thus, for example for $i=10$, $j_i=9$, $Zw_0=0$, $Zw_1=\alpha^5$, $Zw_2=\alpha^{12}$, $Zw_3=\alpha^{16}$ the following results:

$$z(10) = (z_1^{10}, z_2^{10}, z_3^{10}, z_4^{10}, z_5^{10}) = Zw_3 \cdot \alpha^{3 \cdot 9} + Zw_2 \cdot \alpha^{2 \cdot 9} + Zw_1 \cdot \alpha^9 + Zw_0 = \alpha^{16} \cdot \alpha^{27} + \alpha^{12} \cdot \alpha^{18} + \alpha^5 \cdot \alpha^9 + 0 = \alpha^{43} + \alpha^{30} + \alpha^{14} = \alpha^{12} + \alpha^{30} + \alpha^{14} = (01110)^T + (01001)^T + (10111)^T = (10000)^T = \alpha^0 \neq 0$$

and the NOR circuit 25 outputs the correction value $$\Delta v_{10} = \overline{\bar{z}_1^{10} \vee \bar{z}_2^{10} \vee \bar{z}_3^{10} \vee \bar{z}_4^{10} \vee \bar{z}_5^{10}} = \overline{1 \vee 0 \vee 0 \vee 0 \vee 0} = \overline{1} = 0$$

so that no correction of the $10^{th}$ bit is made.

It is still to be noted that when $s_1=s_3=s_5=0$ applies, all correction signals $\Delta v_i$ output by the subcircuits $SK_i$ 13$i$, $i=1, \ldots, n$ are equal 0. Advantageously it is not required, in case the error syndrome $s=(s_1, s_3, s_5)$ indicates no error, to switch off the error correction circuit. In this case for the intermediate values $Zw_0=0$, $Zw_1=0$, $Zw_2=0$, $Zw_3=\alpha^0$ applies and thus $z(i)=z(i)'=\alpha^0$ and the NOR circuit 25 outputs the correction value $\Delta v_i=0$ at its output so that in the correction circuit Vkn 3, 14 in no bit a correction takes place.

Figure 6:
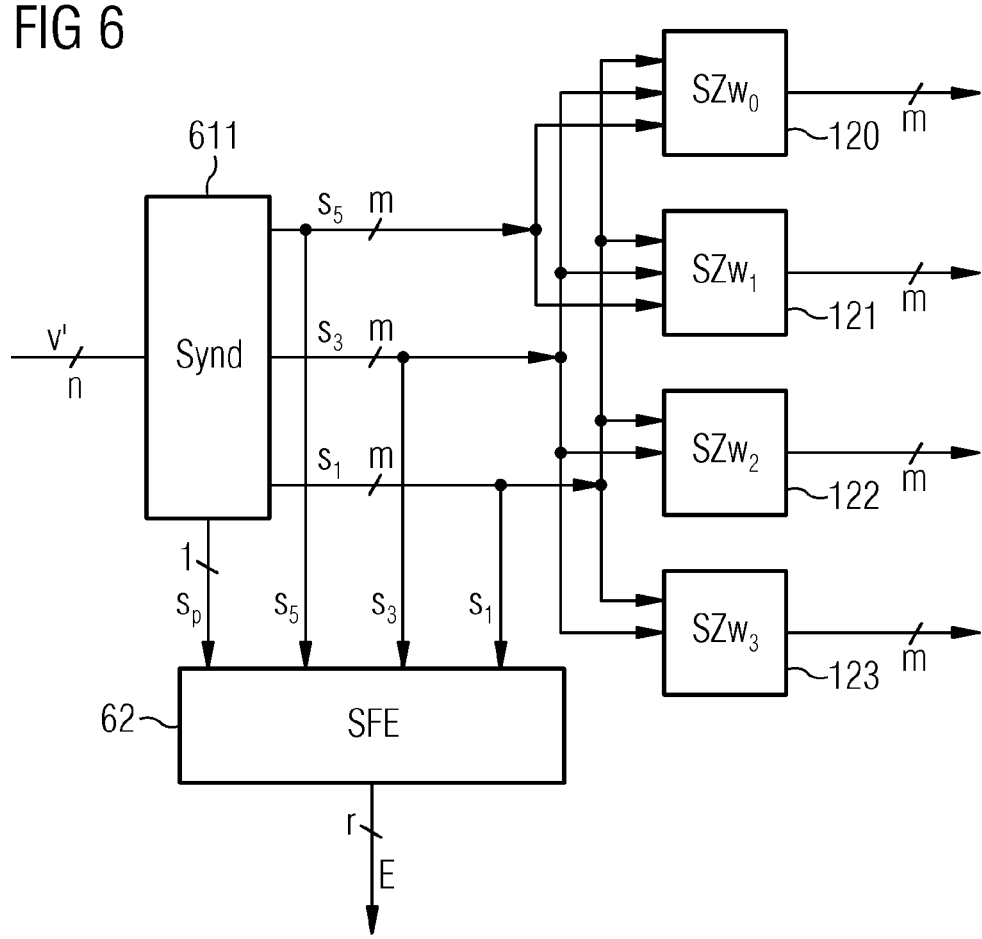
FIG. 6 shows a schematic block diagram of the circuitry of FIG. 1 supplemented by an error detection circuit.

It is illustrated in FIG. 6 how in one embodiment the circuitry illustrated in FIG. 1 may be supplemented by an error detection circuit SFE 62. Those subcircuits in FIG. 6 which correspond to the subcircuits illustrated in FIG. 1 are marked in FIG. 6 with the same reference numerals as in FIG. 1 and are not to be described again.

In contrast to the syndrome generator Synd 11 illustrated in FIG. 1, the syndrome generator Synd 611 illustrated in FIG. 6 comprises an additional 1-bit wide output which carries the signal $s_P$, wherein $s_P = v_1' \oplus v_2' \oplus \ldots \oplus v_n'$ is the parity of the components $v_1', \ldots, v_n'$ of the word $v'$.

The error detection circuit SFE 62 comprises a first 1-bit wide input, a second m-bit wide input, a third m-bit wide input and a fourth m-bit wide input for inputting the subsyndromes $s_P$, $s_5$, $s_3$ and $s_1$ output by syndrome generator Synd 611. It comprises an r-bit wide output at which an r-bit wide error signal $E=E_1, \ldots, E_r$ is output, wherein $r \geq 1$ applies.

It may be provided in embodiments that $r=1$ and $E=E_1$ apply and $E_1$ indicates an error for a first binary value and indicates for a second binary value that no error exists.

In one embodiment it may be provided that $r=5$ and $E=E_1$, $E_2$, $E_3$, $E_4$, $E_5$. Then, for example, a binary value $E_1$ may indicate whether a detectable error exists. A binary value $E_2$ may indicate whether a 1-bit error exists. A binary value $E_3$ may indicate whether a 2-bit error exists. A binary value $E_4$ may indicate whether a 3-bit error exists. A binary value $E_5$ may indicate whether a 4-bit error exists. It may be assumed in the considered embodiment that only 1-bit, 2-bit, 3-bit and 4-bit errors occur.

The error detection circuit SFE may be configured so that it implements the following relationships.

$E_1=1$ when $(s_1, s_3) \neq 0$ $E_1=0$ when $(s_1, s_3) = 0$ $E_1=1$ indicates that a detectable error exists, while $E_1=0$ indicates that no detectable error exists.

$E_2=1$ when $s_1^3+s_3=0$ and $s_P=1$ $E_2=0$ else $E_2=1$ indicates that a 1-bit error exists, while $E_2=0$ indicates that no 1-bit error exists.

$E_3=1$, when $s_1 \neq 0$, $s_P=0$ and $s_1^3 \cdot s_3 + s_1 \cdot s_5 + s_3^2 + s_1^6 = 0$ $E_3=0$ else $E_3=1$ indicates that a 2-bit error exists, while $E_3=0$ indicates that no 2-bit error exists.

$E_4=1$ when $s_1^3+s_3 \neq 0$ and $s_P=1$ $E_4=0$ else $E_4=1$ indicates that a 3-bit error exists, while $E_3=0$ indicates that no 3-bit error exists.

$E_5=1$, when $s_P=0$ and $s_1^3 \cdot s_3 + s_1 \cdot s_5 + s_3^2 + s_1^6 \neq 0$ $E_5=0$ else $E_5=1$ indicates that a 4-bit error exists while $E_5=0$ indicates that no 4-bit error exists.

Surprisingly, the signal $s_1^3 \cdot s_3 + s_1 \cdot s_5 + s_3^2 + s_1^6$ used for differentiating 2- and 4-bit errors may be already provided at the output of the XOR circuit 55 and thus at the output of the subcircuit $SZw_0$ in the implementation of FIG. 5, and does not have to be generated again. The signal $s_1^3+s_3$ may be output at the output of the XOR circuit 57. By implementing the error detection circuit SFE and the subcircuit $SZw_0$ for providing the intermediate value $Zw_0$ together, an especially advantageous implementation may result. Such an implementation is illustrated in FIG. 7.

The circuitry of FIG. 7 comprises the subcircuit $SZw_0$ as it was already described in connection with FIG. 5, and a subcircuit SFE' 71 for error detection. The subcircuits of the subcircuit $SZw_0$ are marked with the same reference numerals as in FIG. 5 and are thus not to be described again.

Figure 7:
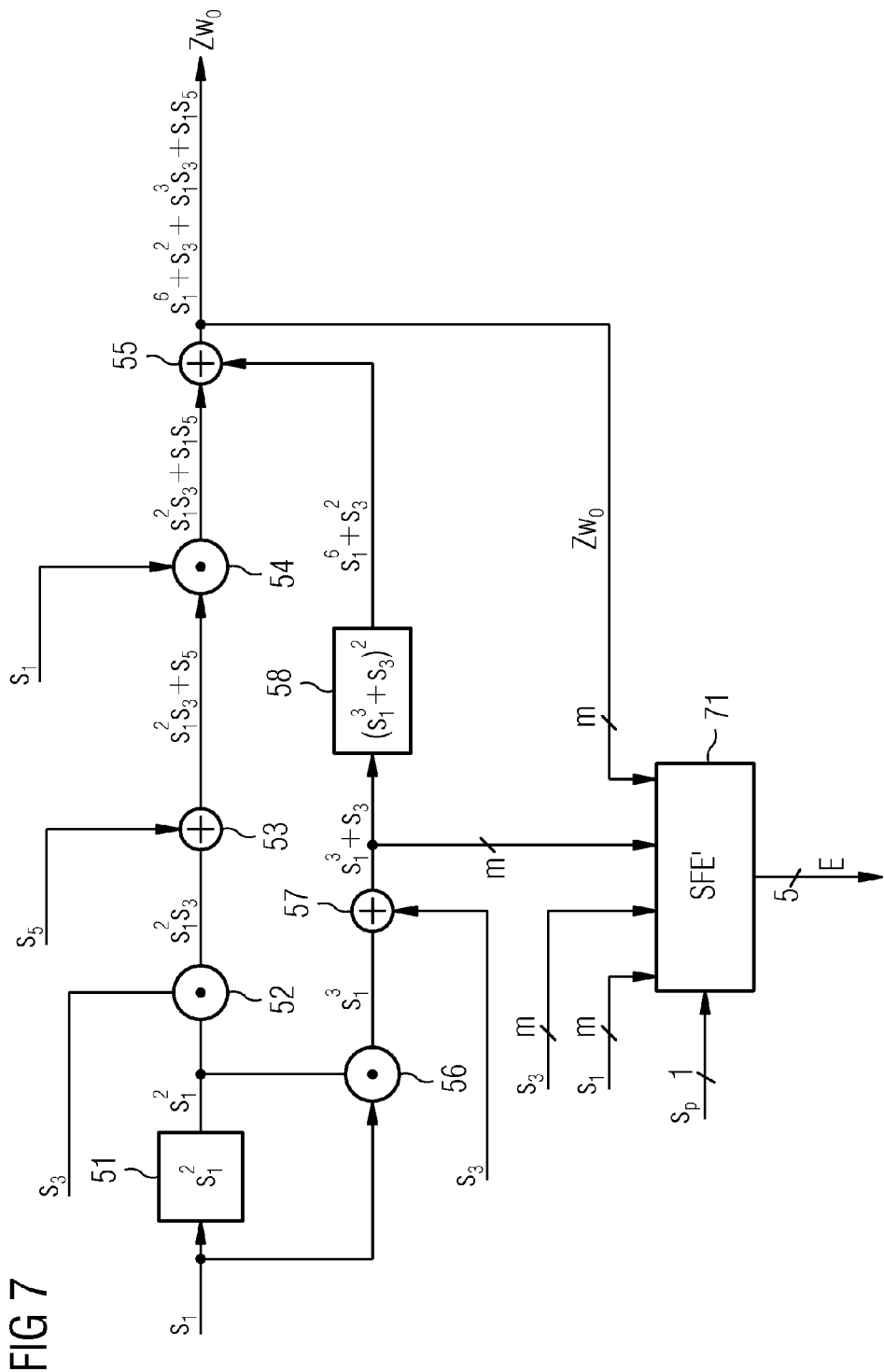
FIG. 7 shows a schematic block diagram of a joint implementation of an error detection circuit and a subcircuit $SZw_0$ for providing the intermediate value $Zw_0$.

The subcircuit $SZw_0$ in FIG. 7 is unchanged as compared to the subcircuit $SZw_0$ in FIG. 5.

The subcircuit SFE' comprises a first 1-bit wide input which carries the subsyndrome $s_P$, a second m-bit wide input which carries the subsyndrome $s_1$, a third m-bit wide input which carries the syndrome $s_3$ and a fourth m-bit wide input which is connected to the m-bit wide output of the XOR circuit 57 and which carries the value $s_1^3+s_3$ and a fifth m-bit wide input which carries the value $Zw_0=s_1^3 \cdot s_3 + s_1 \cdot s_5 + s_3^2 + s_1^6$. In the described embodiment the subcircuit SFE' 71 comprises five binary outputs.

The subcircuit for error detection SFE 62 and the subcircuit $SZw_0$ 120 in FIG. 6 are jointly implemented in FIG. 7.

The subcircuit $SZw_0$ consists of the subcircuits 51, 52, 53, 54, 55, 56, 57, 58 and the subcircuit SFE consists of the subcircuits 51, 52, 53, 54, 55, 56, 57, 58 and 71.

Figure 8:
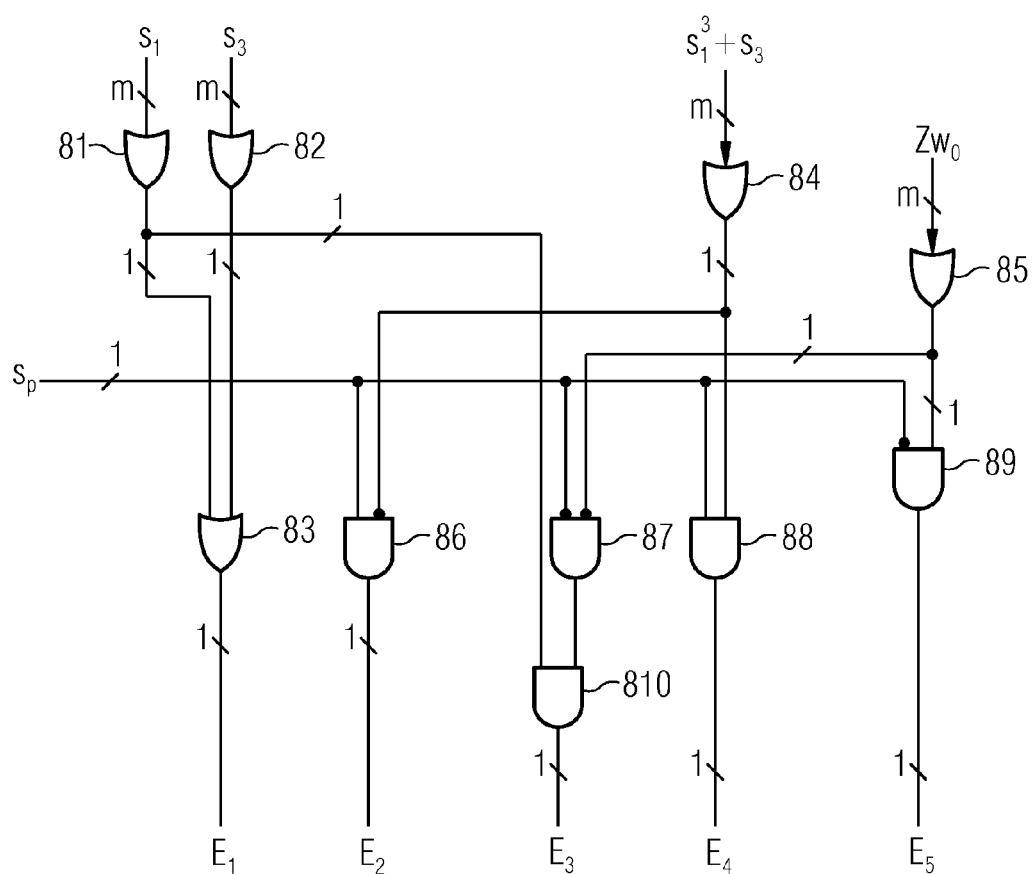
FIG. 8 shows a schematic block diagram of a possible implementation of the error detection circuit of FIG. 7.

One possible implementation of the subcircuit SFE' 71 of FIG. 7 is illustrated in FIG. 8. The first input carrying the 1-bit wide subsyndrome $s_P$ may be connected to a first input of an AND gate 86 having two inputs and one output, connected negated to a first input of an AND gate 87 having two inputs and one output, to a first input of an AND gate 88 having two inputs and one output and connected negated to a first input of an AND gate 89 having two inputs and one output.

The second, m-bit wide input which carries the subsyndrome $s_1$ may be connected to m inputs of an OR circuit 81 having m inputs and one output which outputs the OR operation of the components of the subsyndrome $s_1$ at its 1-bit wide output.

The third m-bit wide input which carries the subsyndrome $s_3$ may be connected to m inputs of an OR circuit 82 having m inputs and one output wherein the circuit outputs the OR operation of the components of the subsyndrome $s_3$ at its 1-bit wide output.

The fourth m-bit wide input which carries the signal $s_1^3+s_3$ which is output by the XOR circuit 57 in FIG. 7 may be connected to m inputs of an OR circuit 84 having m inputs and one output wherein the circuit outputs the OR operation of the components of the signal $s_1^3+s_3$ at its 1-bit wide output.

The fifth m-bit wide input which carries the signal $Zw_0 = s_1^3 \cdot s_3 + s_1 \cdot s_5 + s_3^2 + s_1^6$ which is output by the XOR circuit 55 in FIG. 7 may be connected to m inputs of an OR circuit 85 having m inputs and one output, wherein the circuit outputs the OR combination of the components of the signal $s_1^3 \cdot s_3 + s_1 \cdot s_5 + s_3^2 + s_1^6 s_1^3 + s_3$ at its 1-bit wide output.

The 1-bit wide output of the OR circuit 81 may be connected both to a first input of an OR gate 83 having two inputs and one output and also to a first input of an AND gate 810 having two inputs and one output, wherein the second input of the gate 810 may be connected to the output of the AND gate 87, and wherein the component $E_3$ of the error signal E may be output at the output of the gate 810.

The output of the OR circuit 82 may be connected to the second input of the OR gate 83 whose output may output the components $E_1$ of the error signal E.

The output of the OR-circuit 84 may be connected noninverted with the second input of the AND-gate 88 and inverted with the AND-gate 86. The output of the AND-gate 86 may carry the component $E_2$ of the error signal E.

The AND-gate 88 may output the component E4 of error signal E. The output of the OR-circuit 85 may be connected noninverted with the second input of the AND-gate 89 and inverted with the second input of the AND-gate 810. The AND-gate 89 may output the component E5 of the error signal E. The output of the AND-gate 810 may carry the component E3 of the error signal E.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the disclosure can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the disclosure comprise a data carrier having electronically readable control signals, which are capable of cooperating with a programmable computer system, such that one of the methods described herein is performed.

Generally, embodiments of the present disclosure can be implemented as a computer program product with a program code, the program code being operative for performing one of the methods when the computer program product runs on a computer. The program code may for example be stored on a non-transitory machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or nontransitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the disclosure comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. A circuitry SK for an error correction of at least 1-bit, 2-bit, and 3-bit errors of bits in an n-digit binary word $v' = v'_1, \ldots, v'_n$ which resulted from bit errors from an n-digit codeword $v = v_1, \ldots, v_n$ of a binary BCH code C over the Galois field $GF(2^m)$, wherein $m \geq 4$, wherein the binary BCH code C comprises a code distance of at least $d \geq 7$, wherein the BCH code C comprises an H matrix H, so that m first rows of the H matrix form a submatrix $H_1$, m second rows of the H matrix form a second submatrix $H_3$ and further m rows of the H matrix form a third submatrix $H_5$ with $H_1=(h_1^1,\ldots,h_1^n), H_3=(h_3^1,\ldots,h_3^n)$ and $H_5=(h_5^1,\ldots,h_5^n)$, wherein $h_1^1=\alpha^{j1},\ldots,h_1^n=\alpha^{jn}$, $h_3^1=\alpha^{3(j1)},\ldots,h_3^n=\alpha^{3(jn)}$, $h_5^1=\alpha^{5(j1)},\ldots,h_5^n=\alpha^{5(jn)}$ applies, $\alpha$ is an element of the Galois field GF ($2^m$) in its vector representation as an m-component binary column vector and the respective exponent j of $\alpha^j$ is to be interpreted modulo $2^m-1$, with i=1, ... n, and n≤$2^m-1$ applies, comprising:

a syndrome generator Synd configured to determine an error syndrome s, wherein m first components of s form an m-component subsyndrome $s_1$, m second components of s form a second m-component subsyndrome $s_3$ and further m components of s form a third subsyndrome $s_5$, wherein $s_1=H_1\cdot v', s_3=H_3\cdot v'$, and $s_5=H_5\cdot v'$ apply, wherein the operation · is the operation of the multiplication in the Galois field GF($2^m$), a plurality of subcircuits wherein for each bit $v_i'$ subject to possible error correction of the n-digit binary word $v'=v'_1,\ldots,v'_n$ a subcircuit $SK_i$ exists which is configured so that it forms, from intermediate values $Zw_0$, $Zw_1$, $Zw_2$, $Zw_3$ which are equal for all bit positions subject to possible error correction, a correction value $\Delta v_i$ according to the following relation $$\Delta v_i = \overline{(z_1^i \vee z_2^i \vee \ldots \vee z_m^i)}$$

wherein $\vee$ is the OR-operation,
wherein $(z_1^i, z_2^i, \ldots, z_m^i) = Zw_3\cdot\alpha^{3ji} + Zw_2\cdot\alpha^{2ji} + Zw_1\cdot\alpha^{ji} + Zw_0$ wherein the operation + is the addition of the corresponding elements in the Galois field GF($2^m$) which, in the vector representation, corresponds to the component-wise XOR-combination of the corresponding m-component binary vectors, and the intermediate values $Zw_0$, $Zw_1$, $Zw_2$, $Zw_3$ are determined depending on the subsyndromes $s_1$, $s_3$, $s_5$ so that in case of a 1-bit error or a 2-bit error or a 3-bit error the following applies: $z^i=(z_1^i, z_2^i, \ldots, z_m^i)=(0, 0, \ldots, 0)$ when an error occurred in the bit position i and $z^i=(z_1^i, z_2^i, \ldots, z_m^i)\neq(0, 0, \ldots, 0)$ when no error occurred in the bit position i;

wherein for determining the intermediate values $Zw_0$, $Zw_1$, $Zw_2$, and $Zw_3$ one subcircuit $SZw_0$, $SZw_1$, $SZw_2$ and $SZw_3$ each exists which is each configured so that it provides the same intermediate values $Zw_0$, $Zw_1$, $Zw_2$ and $Zw_3$ from the sub-syndromes $s_1$, $s_3$, $s_5$ for each bit position subject to possible error correction of the word v'; and a combinational circuit Vkn configured to combine bits that are subject to possible error correction $v'_i$, in a component-wise manner with corresponding correction values $\Delta v_i$ provided by the subcircuit $SK_i$ into possibly corrected bits $v_i^{cor}$.

2. The circuitry according to claim 1, wherein the combinational circuit Vkn is configured so that it combines bits $v'_i$ that are subject to possible error correction with corresponding correction values $\Delta v_i$ provided by the subcircuit $SK_i$ into possibly corrected bits $v_i^{cor}$ wherein the combination is an XOR operation and $v_i^{cor}=v'_i\oplus\Delta v_i$ applies.

3. The circuitry according to claim 1, wherein the subcircuits $SZw_0$, $SZw_1$, $SZw_2$ and $SZw_3$ are configured to provide the intermediate values $$Zw_0 = \left(s_1^3 + s_3 + \frac{s_1^3\cdot s_3 + s_1\cdot s_5}{s_1^3 + s_3 + \alpha^0\cdot N(s_1, s_3)}\right),$$

$$Zw_1 = \frac{s_1^2\cdot s_3 + s_5}{s_1^3 + s_3 + \alpha^0\cdot N(s_1, s_3)},$$

$$Zw_2 = s_1,$$

$$Zw_3 = \alpha^0$$

wherein the subcircuits $SZw_0$, $SZw_1$ and $SZw_2$ are configured to provide the intermediate values depending on the subsyndromes $s_1$, $s_3$ and $s_5$,
wherein $$N(s_1, s_3) = \overline{r_1 \vee r_2 \vee \ldots \vee r_m}$$

applies and $(r_1, r_2, \ldots, r_m) = s_1^3 + s_3$ applies.

4. The circuitry according to claim 3, wherein subcircuits for providing intermediate values are at least partially jointly implemented.

5. The circuitry according to claim 1, wherein the subcircuits $SZw_0$, $SZw_1$, $SZw_2$ and $SZw_3$ are configured so that the subcircuits $SZw_0$, $SZw_1$, $SZw_2$, and $SZw_3$ provide the intermediate values $$Zw_0 = F\cdot\left(s_1^3 + s_3 + \frac{s_1^3\cdot s_3 + s_1\cdot s_5}{s_1^3 + s_3 + \alpha^0\cdot N(s_1, s_3)}\right),$$

$$Zw_1 = F\cdot\left(\frac{s_1^2\cdot s_3 + s_5}{s_1^3 + s_3 + \alpha^0\cdot N(s_1, s_3)}\right),$$

$$Zw_2 = F\cdot s_1$$

$$Zw_3 = F\cdot\alpha^0$$

wherein $$N(s_1, s_3) = \overline{r_1 \vee r_2 \vee \ldots \vee r_m}$$

applies and $(r_1, r_2, \ldots, r_m) = s_1^3 + s_3$ applies, wherein F is a factor not equal to zero for all values of the subsyndromes $s_1$, $s_3$, $s_5$.

6. The circuitry according to claim 1, wherein the subcircuits $SZw_0$, $SZw_1$, $SZw_2$, $SZw_3$ are configured so that the subcircuits $SZw_0$, $SZw_1$, $SZw_2$ and $SZw_3$, depending on the sub-syndromes $s_1$, $s_3$, $s_5$, provide the intermediate values $$Zw_0 = s_1^6 + s_3^2 + s_1^3 \cdot s_3 + s_1 \cdot s_5,$$

$$Zw_1 = s_1^2 s_3 + s_5;$$

$$Zw_2 = s_1 \cdot [s_1^3 + s_3 + \alpha^0 \cdot N(s_1, s_3)]$$

$$Zw_3 = s_1^3 + s_3 + \alpha^0 \cdot N(s_1, s_3)$$

wherein $$N(s_1, s_3) = \overline{r_1 \vee r_2 \vee \ldots \vee r_m}$$

applies and $$(r_1, r_2, \ldots, r_m) = s_1^3 + s_3$$

applies.

7. The circuitry according to claim 6, wherein subcircuits for providing intermediate values are at least partially jointly implemented.

8. The circuitry according to claim 1, wherein the parity of the bits $v'_1, \ldots, v'_n$ is determined by at least one component of the error syndrome.

9. The circuitry according to claim 8, wherein the H matrix further comprises a subset of rows, so that the respective components of each column of the H matrix which belong to this subset of rows comprise an odd number of ones.

10. The circuitry according to claim 9, wherein the subset of rows includes one single row.

11. The circuitry according to claim 1, wherein an error detection circuit exists.

12. The circuitry according to claim 11, wherein the error detection circuit indicates whether an i-bit error occurred for at least one $i \in \{1, 2, 3, 4\}$.

13. The circuitry according to claim 11, wherein the error detection circuit and the circuitry for error correction are at least partially jointly implemented.

14. A method for error correction of at least 1-bit, 2-bit, and 3-bit errors of bits in an n-digit binary word $v'=v'_1, \ldots, v'_n$ which resulted from bit errors from an n-digit codeword $v=v_1, \ldots, v_n$ of a binary BCH code C over the Galois field $GF(2^m)$, wherein $m \geq 4$, wherein the binary BCH code C comprises a code distance of at least $d \geq 7$, wherein the binary BCH code C comprises an H matrix H, so that m first rows of the H matrix form a submatrix $H_1$, m second rows of the H matrix form a second submatrix $H_3$ and further m rows of the H matrix form a third submatrix $H_5$ with $$H_1 = (h_1^1, \ldots, h_1^n), H_3 = (h_3^1, \ldots, h_3^n) \text{ and}$$
$$H_5 = (h_5^1, \ldots, h_5^n),$$

wherein $$h_1^1 = \alpha^{j1}, \ldots, h_1^n = \alpha^{jn},$$

$$h_3^1 = \alpha^{3(j1)}, \ldots, h_3^n = \alpha^{3(jn)},$$

$$h_5^1 = \alpha^{5(j1)}, \ldots, h_5^n = \alpha^{5(jn)},$$

applies, $\alpha$ is an element of the Galois field $GF(2^m)$ in its vector representation as an m-component binary column vector and the respective exponent j of $\alpha^j$ is to be interpreted modulo $2^m - 1$ and $n \leq 2^m - 1$, with $i = 1, \ldots, n$, applies, wherein the method comprises:

determining an error syndrome s, wherein m first components of s form an m-component subsyndrome $s_1$, m second components of s form a second m-component subsyndrome $s_3$ and further m components of s form a third subsyndrome $s_5$, wherein $$s_1 = H_1 \cdot v', s_3 = H_3 \cdot v', \text{ and } s_5 = H_5 \cdot v'$$

apply, wherein the · operation is the operation of the multiplication in the Galois field $GF(2^m)$, determining intermediate values $Zw_0, Zw_1, Zw_2$, and $Zw_3$, wherein the intermediate values $SZw_0, SZw_1$ and $SZw_2$ are determined from the sub-syndromes $s_1, s_3, s_5$, the intermediate values being the same for each bit position subject to possible error correction of the word v';

forming a correction value $\Delta v_i$ for each bit $v_i'$ subject to possible error correction from the intermediate values $Zw_0, Zw_1, Zw_2, Zw_3$ which are equal for all bit positions subject to possible error correction, a according to the following relation $$\Delta v_i = \overline{(z_1^i \vee z_2^i \vee \ldots \vee z_m^i)}$$

wherein v is the OR-operation,
wherein $$(z_1^i, z_2^i, \ldots, z_m^i) = Zw_3 \cdot \alpha^{3ji} + Zw_2 \cdot \alpha^{2ji} + Zw_1 \cdot \alpha^{ji} + Zw_0$$

wherein the operation + is the addition of the corresponding elements in the Galois field $GF(2^m)$ which, in the vector representation, corresponds to the component-wise XOR-combination of the corresponding m-component binary vectors, and the intermediate values $Zw_0, Zw_1, Zw_2, Zw_3$ are determined depending on the subsyndromes $s_1, s_3, s_5$ so that in case of a 1-bit error or a 2-bit error or a 3-bit error the following applies: $z^i = (z_1^i, z_2^i, \ldots, z_m^i) = (0, 0, \ldots, 0)$ when an error occurred in the bit position i and $z^i = (z_1^i, z_2^i, \ldots, z_m^i) \neq (0, 0, \ldots, 0)$ when no error occurred in the bit position i; and combining bits that are subject to possible error correction $v'_i$ in a componentwise manner with corresponding correction values $\Delta v_i$ into possibly corrected bits $v_i^{cor}$.

15. The method according to claim 14, wherein combining bits $v'_i$ that are subject to possible error correction with corresponding correction values $\Delta v_i$ comprises performing an XOR operation so that $v_i^{cor} = v'_i \oplus \Delta v_i$ applies.

16. The method according to claim 14, wherein determining the intermediate values $Zw_0, Zw_1, Zw_2$, and $Zw_3$ is based on the following relations:

$$Zw_0 = \left( s_1^3 + s_3 + \frac{s_1^3 \cdot s_3 + s_1 \cdot s_5}{s_1^3 + s_3 + \alpha^0 \cdot N(s_1, s_3)} \right),$$

$$Zw_1 = \frac{s_1^2 \cdot s_3 + s_5}{s_1^3 + s_3 + \alpha^0 \cdot N(s_1, s_3)},$$

$$Zw_2 = s_1,$$

$$Zw_3 = \alpha^0$$

wherein $$N(s_1, s_3) = \overline{r_1 \vee r_2 \vee \ldots \vee r_m}$$

applies and $$(r_1, r_2, \ldots, r_m) = s_1^3 + s_3$$

applies.

17. The method according to claim 14, wherein determining the intermediate values $Zw_0, Zw_1, Zw_2$, and $Zw_3$ is based on the following relations:

$Zw_0 = s_1^6 + s_3^2 + s_1^3 \cdot s_3 + s_1 \cdot s_5,$ $Zw_1 = s_1^2 s_3 + s_5;$ $Zw_2 = s_1 \cdot [s_1^3 + s_3 + \alpha^0 \cdot N(s_1, s_3)]$ $Zw_3 = s_1^3 + s_3 + \alpha^0 \cdot N(s_1, s_3)$ wherein $N(s_1, s_3) = \overline{r_1 \vee r_2 \vee \ldots \vee r_m}$ applies and $(r_1, r_2, \ldots, r_m) = s_1^3 + s_3$ applies.

18. A non-transitory storage medium having stored thereon a computer program having a program code for performing, when running on a computer, a method for error correction of at least 1-bit, 2-bit and 3-bit errors of bits in an n-digit binary word $v'=v'_1, \ldots, v'_n$ which resulted from bit errors from an n-digit codeword $v=v_1, \ldots, v_n$ of a binary BCH code C over the Galois field $GF(2^m)$, wherein $m \geq 4$, wherein the binary BCH code C comprises a code distance of at least $d \geq 7$, wherein the binary BCH code C comprises an H matrix H, so that m first rows of the H matrix form a submatrix $H_1$, m second rows of the H matrix form a second submatrix $H_3$ and further m rows of the H matrix form a third submatrix $H_5$ with $H_1 = (h_1^1, \ldots, h_1^n), H_3 = (h_3^1, \ldots, h_3^n)$ and $H_5 = (h_5^1, \ldots, h_5^n),$ wherein $h_1^1 = \alpha^{j_1}, \ldots, h_1^n = \alpha^{j_n},$ $h_3^1 = \alpha^{3(j_1)}, \ldots, h_3^n = \alpha^{3(j_n)},$ $h_5^1 = \alpha^{5(j_1)}, \ldots, h_5^n = \alpha^{5(j_n)},$ applies, $\alpha$ is an element of the Galois field $GF(2^m)$ in its vector representation as an m-component binary column vector and the respective exponent j of $\alpha^j$ is to be interpreted modulo $2^m - 1$, with $i=1, \ldots, n$, and $n \leq 2^m - 1$ applies, wherein the method comprises:

determining an error syndrome s, wherein m first components of s form an m-component subsyndrome $s_1$, m second components of s form a second m-component subsyndrome $s_3$ and further m components of s form a third subsyndrome $s_5$, wherein $s_1 = H_1 \cdot v', s_3 = H_3 \cdot v',$ and $s_5 = H_5 \cdot v'$ apply, wherein the · operation is the operation of the multiplication in the Galois field $GF(2^m)$, determining intermediate values $Zw_0, Zw_1, Zw_2,$ and $Zw_3$, wherein the intermediate values $Zw_0, Zw_1$ and $Zw_2$ are determined from the sub-syndromes $s_1, s_3, s_5$, the intermediate values being the same for each bit position subject to possible error correction of the word v';

forming a correction value $\Delta v_i$ for each bit $v_i'$ subject to possible error correction from the intermediate values $Zw_0, Zw_1, Zw_2, Zw_3$ which are equal for all bit positions subject to possible error correction, a according to the following relation $\Delta v_i = \overline{(z_1^i \vee z_2^i \vee \ldots \vee z_m^i)}$ wherein v is the OR-operation,
wherein $(z_1^i, z_2^i, \ldots, z_m^i) = Zw_3 \cdot \alpha^{3ji} + Zw_2 \cdot \alpha^{2ji} + Zw_1 \cdot \alpha^{ji} + Zw_0$ and the intermediate values $Zw_0, Zw_1, Zw_2, Zw_3$ are determined depending on the subsyndromes $s_1, s_3, s_5$ so that in case of a 1-bit error or a 2-bit error or a 3-bit error the following applies: $z^i = (z_1^i, z_2^i, \ldots, z_m^i) = (0, 0, \ldots, 0)$ when an error occurred in the bit position i and $z^i = (z_1^i, z_2^i, \ldots, z_m^i) \neq (0, 0, \ldots, 0)$ when no error occurred in the bit position i; and combining bits that are subject to possible error correction $v_i'$ in a componentwise manner with corresponding correction values $\Delta v_i$ into possibly corrected bits $v_i^{cor}$.

\* \* \* \* \*